(12) United States Patent
Yoshida

(10) Patent No.: US 12,269,068 B2
(45) Date of Patent: Apr. 8, 2025

(54) SUBSTRATE PROCESSING METHOD AND SUBSTRATE PROCESSING DEVICE

(71) Applicant: SCREEN Holdings Co., Ltd., Kyoto (JP)

(72) Inventor: Yukifumi Yoshida, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 103 days.

(21) Appl. No.: 17/616,709

(22) PCT Filed: Jun. 1, 2020

(86) PCT No.: PCT/JP2020/021538
§ 371 (c)(1),
(2) Date: Dec. 6, 2021

(87) PCT Pub. No.: WO2020/261880
PCT Pub. Date: Dec. 30, 2020

(65) Prior Publication Data
US 2022/0323998 A1 Oct. 13, 2022

(30) Foreign Application Priority Data
Jun. 28, 2019 (JP) .................. 2019-122030

(51) Int. Cl.
*B08B 3/02* (2006.01)
*B08B 3/08* (2006.01)
*B08B 7/00* (2006.01)

(52) U.S. Cl.
CPC .................. *B08B 3/02* (2013.01); *B08B 3/08* (2013.01); *B08B 7/0014* (2013.01)

(58) Field of Classification Search
CPC ........... B08B 3/02; B08B 3/08; B08B 7/0014; H01L 21/67017; H01L 21/67028; H01L 21/67051; H01L 21/02057
See application file for complete search history.

(56) References Cited

U.S. PATENT DOCUMENTS

2014/0144465 A1  5/2014  Kaneko et al. ................. 134/4
2015/0128994 A1*  5/2015  Kaneko ............. H01L 21/02052
                                                      134/4
(Continued)

FOREIGN PATENT DOCUMENTS

CN    104637784 A    5/2015
CN    105824202 A    8/2016
(Continued)

OTHER PUBLICATIONS

JP 2018174346 A (Year: 2018).*
(Continued)

*Primary Examiner* — Alexander Markoff
(74) *Attorney, Agent, or Firm* — OSTROLENK FABER LLP

(57) ABSTRACT

A substrate processing method that includes a processing liquid supplying step which supplies a processing liquid to a surface of a substrate, a processing film forming step in which the processing liquid on the surface of the substrate is solidified or cured to form a processing film that holds removal objects present on the surface of the substrate, and a removing step in which a removing liquid is supplied to the surface of the substrate to thereby remove the processing film from the surface of the substrate in a state that the removal objects are held by the processing film. The processing liquid contains a dissolution component which dissolves at least one of a front layer of the substrate and the removal objects as a dissolution object. The processing liquid supplying step includes a dissolution step which partially dissolves the dissolution object by the dissolution component in the processing liquid supplied to the surface of the substrate.

10 Claims, 14 Drawing Sheets

(56) References Cited

U.S. PATENT DOCUMENTS

| | | |
|---|---|---|
| 2015/0128995 A1 | 5/2015 | Kaneko et al. |
| 2016/0035561 A1* | 2/2016 | Aibara ..................... B08B 3/08 |
| | | 134/4 |
| 2016/0035564 A1* | 2/2016 | Aibara ................ H01L 21/6715 |
| | | 134/4 |
| 2017/0345685 A1 | 11/2017 | Sekiguchi et al. |
| 2019/0091736 A1 | 3/2019 | Okutani et al. |
| 2019/0091737 A1* | 3/2019 | Yoshida ................ B08B 7/0014 |
| 2019/0176179 A1 | 6/2019 | Yoshida et al. |
| 2019/0371599 A1* | 12/2019 | Yoshida ............. H01L 21/6715 |
| 2022/0323998 A1* | 10/2022 | Yoshida .................... B08B 3/02 |

FOREIGN PATENT DOCUMENTS

| | | |
|---|---|---|
| CN | 109545655 A | 3/2019 |
| CN | 109904093 A | 6/2019 |
| JP | 2015-062259 A | 4/2015 |
| JP | 2015-095583 A | 5/2015 |
| JP | 2016-036012 A | 3/2016 |
| JP | 2017-216431 A | 12/2017 |
| JP | 6279037 B2 | 2/2018 |
| TW | 201919783 A | 6/2019 |

OTHER PUBLICATIONS

International Preliminary Report on Patentability (Chapter I) mailed Jan. 6, 2022 with a copy of Notification from the International Bureau (Form PCT/IB/326) in corresponding PCT International Application No. PCT/JP2020/021538 in Japanese.

English translation of the International Preliminary Report on Patentability (Chapter I) mailed Jan. 6, 2022 with a copy of Notification from the International Bureau (Form PCT/IB/338) in corresponding PCT International Application No. PCT/JP2020/021538 in English.

International Search Report mailed Aug. 11, 2020 in corresponding PCT International Application No. PCT/JP2020/021538.

Written Opinion mailed Aug. 11, 2020 in corresponding PCT International Application No. PCT/JP2020/021538.

* cited by examiner

SUBSTRATE PROCESSING METHOD AND SUBSTRATE PROCESSING DEVICE

CROSS-REFERENCE TO RELATED APPLICATIONS

The present application is a 35 U.S.C. §§ 371 national phase conversion of International Application No. PCT/JP2020/021538, filed Jun. 1, 2020, which claims priority to Japanese Patent Application No. 2019-122030, filed Jun. 28, 2019, the contents of both of which are incorporated herein by reference. The PCT International Application was published in the Japanese language.

TECHNICAL FIELD

The present invention relates to a substrate processing method and a substrate processing apparatus for processing substrates. Examples of substrates to be processed include substrates such as semiconductor wafers, substrates for liquid crystal display devices, substrates for FPDs (flat panel displays) such as organic EL (electroluminescence) display devices, etc., substrates for optical disks, substrates for magnetic disks, substrates for magneto-optical disks, substrates for photomasks, ceramic substrates, substrates for solar cells, etc.

BACKGROUND ART

In a manufacturing process of semiconductor devices, a cleaning step is executed in order to remove various types of contaminants adhering to a substrate, residues of a processing liquid, a resist, etc., used in a prior step, or various particles, etc. (which may hereinafter be collectively referred to as "removal objects").

In the cleaning step, in general, a cleaning liquid such as deionized water (DIW) is supplied to a substrate to remove removal objects by physical actions of the cleaning liquid, or a chemical liquid which chemically reacts with the removal objects is supplied to the substrate to chemically remove the removal objects.

However, an uneven pattern formed on a substrate becomes finer and more complex. Therefore, it becomes more difficult to remove the removal objects by using a cleaning liquid or a chemical liquid, while suppressing damage to the uneven pattern.

Thus, there has been proposed such a method that a topcoat liquid which contains a volatile component is supplied toward a substrate to form a topcoat film by volatilization of the volatile component, and the topcoat film is thereafter removed (refer to Patent Literature 1).

In this method, the topcoat liquid is solidified or cured, while shrinking its volume, to form the topcoat film. Thereby, removal objects are separated from the substrate. Then, the topcoat film is dissolved by a removing liquid and removed from the substrate.

CITATION LIST

Patent Literature

Patent Literature 1: Japanese Patent No. 6279037

SUMMARY OF INVENTION

Technical Problem

In the substrate processing method described in Patent Literature 1, the topcoat film is dissolved on the substrate. Therefore, on the substrate, removal objects may fall off from the topcoat film and the fallen removal objects may reattach to the substrate. Consequently, the removal objects may not be efficiently removed from the substrate.

Thus, an object of the present invention is to provide a substrate processing method and a substrate processing apparatus capable of efficiently removing removal objects present on a surface of a substrate.

Solution to Problem

A preferred embodiment of the present invention is to provide a substrate processing method including a processing liquid supplying step which supplies a processing liquid to a surface of a substrate, a processing film forming step in which the processing liquid on the surface of the substrate is solidified or cured to form a processing film that holds removal objects present on the surface of the substrate, and a removing step in which a removing liquid is supplied to the surface of the substrate to thereby remove the processing film from the surface of the substrate in a state that the removal objects are held by the processing film. The processing liquid contains a dissolution component which dissolves at least one of a front layer of the substrate and the removal objects as a dissolution object. Moreover, the processing liquid supplying step includes a dissolution step which partially dissolves the dissolution object by the dissolution component in the processing liquid supplied to the surface of the substrate.

According to this method, the dissolution object (at least one of the front layer of the substrate and the removal objects) is partially dissolved by the dissolution component contained in the processing liquid. Therefore, the processing liquid supplying step is executed, by which the processing liquid easily enters between the removal objects and the surface of the substrate. In the processing film forming step, if the processing liquid is solidified or cured in a state that the processing liquid has entered between the removal object and the surface of the substrate, a part of the processing film is formed between the removal objects and the surface of the substrate. Therefore, in the removing step, the processing film is removed from the surface of the substrate, while holding the removal objects with a sufficient holding force. As a result, it is possible to efficiently remove the removal objects from the surface of the substrate.

Incidentally, unlike the above-described method, according to a method that after supply of a dissolving liquid that contains a dissolution component to a substrate, the dissolving liquid is rinsed by a rinse liquid and a processing film forming liquid necessary for forming a processing film is thereafter supplied to the substrate, the plurality of liquids are sequentially supplied to the surface of the substrate. Therefore, removal objects which have once separated from the surface of the substrate by the dissolving liquid may reattach to the surface of the substrate before being held by the processing film.

On the contrary, if after supply of a processing liquid that contains a dissolution component to a substrate, the processing liquid is solidified or cured to form a processing film, it is possible to form the processing film, without replacement of the processing liquid by another liquid. Therefore, after the dissolution object is dissolved, the processing film can be formed quickly. Consequently, it is possible to form the processing film while maintaining a state that removal objects are separated from the surface of the substrate.

In a preferred embodiment of the present invention, the processing film forming step includes a dissolution suppressing step in which the processing liquid is solidified or cured to thereby suppress the progress of dissolution of the dissolution object by the dissolution component. Therefore, it is possible to avoid an excessive dissolution of the dissolution object by the dissolution component.

In a preferred embodiment of the present invention, the dissolution object includes at least the front layer of the substrate. Then, the dissolution suppressing step includes a step of dissolving the front layer of the substrate by the dissolution component in the processing film in the vicinity of a contact interface between the processing film and the substrate.

Therefore, the dissolution component in the processing film in the vicinity of the contact interface between the processing film and the substrate is consumed. Since the processing film is formed by the processing liquid that is solidified or cured, the dissolution component is difficult to diffuse in the processing film. Consequently, dissolution of the front layer of the substrate by the dissolution component in the processing film is suppressed along with the consumption of the dissolution component in the processing film in the vicinity of the contact interface between the processing film and the substrate.

Further, not only when a liquid film of the processing liquid is present on the surface of the substrate but also after the processing film has been formed, the front layer of the substrate is dissolved by the dissolution component. It is therefore possible to reduce close adhesion of the processing film to the substrate. Thereby, in the removing step after the processing film forming step, the processing film is easily peeled from the surface of the substrate. That is, the processing film in a state of holding removal objects can be efficiently removed from the surface of the substrate.

In a preferred embodiment of the present invention, the dissolution object includes at least the front layer of the substrate. Then, the dissolution suppressing step includes a step of dissolving the front layer of the substrate by the dissolution component in the processing film to thereby form a gap between the processing film and the surface of the substrate.

According to this method, the front layer of the substrate is dissolved to form the gap between the processing film and the surface of the substrate. Since the processing film is formed by the processing liquid which is solidified or cured, it is lower in fluidity than the processing liquid. Therefore, the gap formed between the processing film and the surface of the substrate is maintained without being filled by the processing film. Therefore, in the removing step after the processing film forming step, the removing liquid easily enters the gap between the processing film and the surface of the substrate. Thereby, the processing film in a state of holding removal objects can be efficiently removed from the surface of the substrate.

In a preferred embodiment of the present invention, the processing liquid has a solute and a solvent which dissolves the solute. The solute has the dissolution component, a high solubility component, and a low solubility component which is less likely to be dissolved in the removing liquid than the high solubility component. The processing film forming step includes a step of forming the processing film that has the high solubility component in a solid state, the low solubility component in a solid state, and the dissolution component in a solid state. Then, the removing step includes a step of selectively dissolving in the removing liquid the high solubility component in a solid state in the processing film.

According to this method, the high solubility component in a solid state in the processing film is selectively dissolved by the removing liquid. The expression "the high solubility component in a solid state is selectively dissolved" does not mean that only the high solubility component in a solid state is dissolved. "The high solubility component in a solid state is selectively dissolved" means that although the low solubility component in a solid state is slightly dissolved, the high solubility component in a solid state is mostly dissolved.

Therefore, by dissolving the high solubility component in a solid state in the removing liquid, the removing liquid can act on a contact interface between the processing film and the substrate. On the other hand, the low solubility component in the processing film is maintained in a solid state without being dissolved. Consequently, while removal objects are held by the low solubility component in a solid state, the removing liquid can act on a contact interface between the low solubility component in a solid state and the substrate. As a result, it is possible to quickly remove the processing film from the surface of the substrate and efficiently remove the removal objects together with the processing film from the surface of the substrate.

In a preferred embodiment of the present invention, the removal objects present on the surface of the substrate are chemically bonded to the surface of the substrate. The expression "the removal objects are chemically bonded to the surface of the substrate" means that molecules or atoms which constitute the removal objects bond to molecules or atoms which constitute the front layer of the substrate by a covalent bond, an ionic bond, a metallic bond, etc.

In order to separate the removal objects held by the processing film from the surface of the substrate, such a method is conceivable that the removing liquid is supplied at a great flow rate to the surface of the substrate, thereby increasing a physical force (kinetic energy) acting on the removal objects from the removing liquid. However, where the removal objects are chemically bonded to the surface of the substrate, the removal objects are held by the processing film, and it is therefore difficult to separate the removal objects from the surface of the substrate by a physical force of the removing liquid alone, even if the physical force received from the removing liquid is increased.

Thus, at least one of the front layer of the substrate and the removal objects is dissolved by the dissolution component contained in the processing liquid, which makes it possible to separate the removal objects from the surface of the substrate, irrespective of the bonding strength of the removal objects with the surface of the substrate. Consequently, even where the removal objects are chemically bonded to the surface of the substrate, the removal objects can be efficiently removed from the surface of the substrate.

In a preferred embodiment of the present invention, the dissolution object includes at least the removal objects. Then, the removal objects include a removal film which covers at least a part of the surface of the substrate. For example, there is a case in which a film-like residue (removal film) which covers at least a part of the surface of the substrate may appear on the surface of the substrate after dry etching. Unlike the above-described method, where a processing film is formed by a processing liquid that does not contain a dissolution component, it is difficult for the processing liquid to enter between the removal film and the surface of the substrate at a portion of the surface of the substrate that is covered by the removal film.

Thus, if the removal film can be partially dissolved in the dissolution component in the processing liquid, it is easy for the processing liquid to enter between the removal film and the surface of the substrate. Further, if the removal film can be split by the dissolution component in the processing liquid, through a gap between film fragments that have been thus split, the processing liquid can more efficiently enter between the film fragments of the removal film and the surface of the substrate.

In a preferred embodiment of the present invention, the dissolution object includes at least the removal objects. The removal objects are residues generated by chemical mechanical polishing (CMP). On the surface of the substrate after the chemical mechanical polishing, there may appear removal objects having the same degree of solubility in the dissolution component as the front layer of the substrate. Thus, if the front layer of the substrate can be dissolved by the dissolution component, portions of the removal objects in the vicinity of the surface thereof are also dissolved. Therefore, it is easy for the processing liquid to enter between the removal objects and the surface of the substrate.

Another preferred embodiment of the present invention is to provide a substrate processing apparatus including a processing liquid supplying unit which supplies a processing liquid to a surface of a substrate, a processing film forming unit by which the processing liquid on the surface of the substrate is solidified or cured to form a processing film that holds removal objects present on the surface of the substrate, a removing liquid supplying unit which supplies a removing liquid to the surface of the substrate to thereby remove the processing film from the surface of the substrate, and a controller which controls the processing liquid supplying unit, the processing film forming unit, and the removing liquid supplying unit.

The controller is programmed so as to execute a processing liquid supplying step which supplies the processing liquid from the processing liquid supplying unit toward the surface of the substrate, a processing film forming step in which the processing liquid on the surface of the substrate is solidified or cured by the processing film forming unit to form the processing film on an upper surface of the substrate, and a removing step in which the removing liquid is supplied from the removing liquid supplying unit toward the surface of the substrate to thereby remove the processing film from the surface of the substrate in a state that the removal objects are held by the processing film. The processing liquid contains a dissolution component which dissolves at least one of the front layer of the substrate and the removal objects as a dissolution object. Then, the controller is programmed so as to execute a dissolution step which partially dissolves the dissolution object by the dissolution component in the processing liquid that is supplied to the surface of the substrate, in the processing liquid supplying step.

According to this apparatus, the dissolution object (at least one of the front layer of the substrate and the removal objects) is partially dissolved by the dissolution component that is contained in the processing liquid. Therefore, the processing liquid supplying step is executed, by which the processing liquid easily enters between the removal objects and the surface of the substrate. If the processing liquid is solidified or cured in a state that the processing liquid has entered between the removal objects and the surface of the substrate, in the processing film forming step, a part of the processing film is formed between the removal objects and the surface of the substrate. Therefore, in the removing step, the processing film is removed from the surface of the substrate, while holding the removal objects with a sufficient holding force. As a result, the removal objects can be efficiently removed from the surface of the substrate.

Unlike the above-described apparatus, where after supply of a dissolving liquid that contains a dissolution component to a substrate, the dissolving liquid is rinsed by a rinse liquid and a processing film forming liquid necessary for forming a processing film is thereafter supplied to the substrate, the plurality of liquids are supplied sequentially to the surface of the substrate. Therefore, removal objects which have once separated from the surface of the substrate by the dissolving liquid may reattach to the surface of the substrate before being held by the processing film.

On the other hand, if after supply of the processing liquid that contains a dissolution component to the substrate, the processing liquid is solidified or cured to form a processing film, the processing film can be formed without replacement of the processing liquid by another liquid. Therefore, the processing film can be formed quickly after dissolution of the dissolution object. Consequently, it is possible to form the processing film while maintaining a state that removal objects are separated from the surface of the substrate.

In another preferred embodiment of the present invention, the controller is programmed so as to execute a dissolution suppressing step in which the processing liquid is solidified or cured, in the processing film forming step to thereby suppress the progress of dissolution of the dissolution object by the dissolution component. It is therefore possible to avoid an excessive dissolution of the dissolution object by the dissolution component.

In another preferred embodiment of the present invention, the dissolution object includes at least the front layer of the substrate. Then, the controller is programmed so as to execute a step of dissolving the front layer of the substrate by the dissolution component in the processing film in the vicinity of a contact interface between the processing film and the substrate, in the dissolution suppressing step.

Therefore, the dissolution component in the processing film in the vicinity of the contact interface between the processing film and the substrate is consumed. Since the processing film is formed by the processing liquid which is solidified or cured, the dissolution component is difficult to diffuse in the processing film. Consequently, dissolution of the front layer of the substrate by the dissolution component in the processing film is suppressed along with the consumption of the dissolution component in the processing film in the vicinity of the contact interface between the processing film and the substrate.

Further, not only when the liquid film of the processing liquid is present on the surface of the substrate but also after the processing film has been formed, the front layer of the substrate is dissolved by the dissolution component. It is therefore possible to reduce close adhesion of the processing film to the substrate. Thereby, in the removing step after the processing film forming step, the processing film can be easily peeled from the surface of the substrate. That is, the processing film in a state of holding the removal objects can be efficiently removed from the surface of the substrate.

In another preferred embodiment of the present invention, the dissolution object includes at least the front layer of the substrate. Then, the controller is programmed so as to execute a step of dissolving the front layer of the substrate by the dissolution component in the processing film, in the dissolution suppressing step to thereby form a gap between the processing film and the surface of the substrate.

According to this apparatus, the front layer of the substrate is dissolved to form the gap between the processing film and the surface of the substrate. Since the processing film is formed by the processing liquid that is solidified or cured, it is lower in fluidity than the processing liquid. Therefore, the gap that is formed between the processing film and the surface of the substrate is maintained without being filled by the processing film. Therefore, in the removing step after the processing film forming step, the removing liquid easily enters the gap between the processing film and the surface of the substrate. Thereby, the processing film in a state of holding the removal objects can be efficiently removed from the surface of the substrate.

In another preferred embodiment of the present invention, the processing liquid has a solute and a solvent that dissolves the solute. The solute has the dissolution component, a high solubility component, and a low solubility component which is less likely to be dissolved in the removing liquid than the high solubility component. Then, the controller is programmed so as to form the processing film that has the high solubility component in a solid state, the low solubility component in a solid state, and the dissolution component in a solid state in the processing film forming step and so as to selectively dissolve in the removing liquid the high solubility component in a solid state in the processing film in the removing step.

According to this apparatus, the high solubility component in a solid state that is in a processing film is selectively dissolved by the removing liquid. Therefore, the high solubility component in a solid state is dissolved in the removing liquid, thus the removing liquid can act on a contact interface between the processing film and the substrate. On the other hand, the low solubility component in the processing film is maintained in a solid state without being dissolved. Consequently, the removing liquid can act on a contact interface between the low solubility component in a solid state and the substrate, while removal objects are held by the low solubility component in a solid state. As a result, it is possible to quickly remove the processing film from the surface of the substrate and efficiently remove the removal objects together with the processing film from the surface of the substrate.

In another preferred embodiment of the present invention, the removal objects present on the surface of the substrate are chemically bonded to the surface of the substrate. If at least one of the front layer of the substrate and the removal objects is dissolved by the dissolution component contained in the processing liquid, the removal objects can be separated from the surface of the substrate, irrespective of the bonding strength of the removal objects with the surface of the substrate. Consequently, even where the removal objects are chemically bonded to the surface of the substrate, the removal objects can be efficiently removed from the surface of the substrate.

In another preferred embodiment of the present invention, the dissolution object includes at least the removal objects. Then, the removal objects include a removal film which covers at least a part of the surface of the substrate. As described previously, the film-like residue (removal film) which covers at least a part of the surface of the substrate may appear, for example, on the surface of the substrate after dry etching. Unlike this apparatus, where a processing film is formed by a processing liquid that does not have a dissolution component, it is difficult for the processing liquid to enter between a removal film and a surface of a substrate at a portion of the surface of the substrate which is covered by the removal film.

Thus, if the removal film can be partially dissolved in the dissolution component in the processing liquid, it is easy for the processing liquid to enter between the removal film and the surface of the substrate. Further, if the removal film can be split by the dissolution component in the processing liquid, through a gap between film fragments that have been split, the processing liquid can enter more efficiently between the film fragments of the removal film and the surface of the substrate.

In another preferred embodiment of the present invention, the dissolution object includes at least the removal objects. The removal objects are residues generated by CMP. As described previously, on the surface of the substrate after CMP, there may appear removal objects having the same degree of solubility in the dissolution component as the front layer of the substrate. Thus, if the front layer of the substrate can be dissolved by the dissolution component, portions of the removal objects in the vicinity of the surfaces thereof can also be dissolved. Therefore, it is easy for the processing liquid to enter between the removal objects and the surface of the substrate.

The aforementioned as well as yet other objects, features, and effects of the present invention will be made clear by the following description of the preferred embodiments, with reference to the accompanying drawings.

DESCRIPTION OF EMBODIMENTS

<Configuration of Substrate Processing Apparatus>

Figure 1:
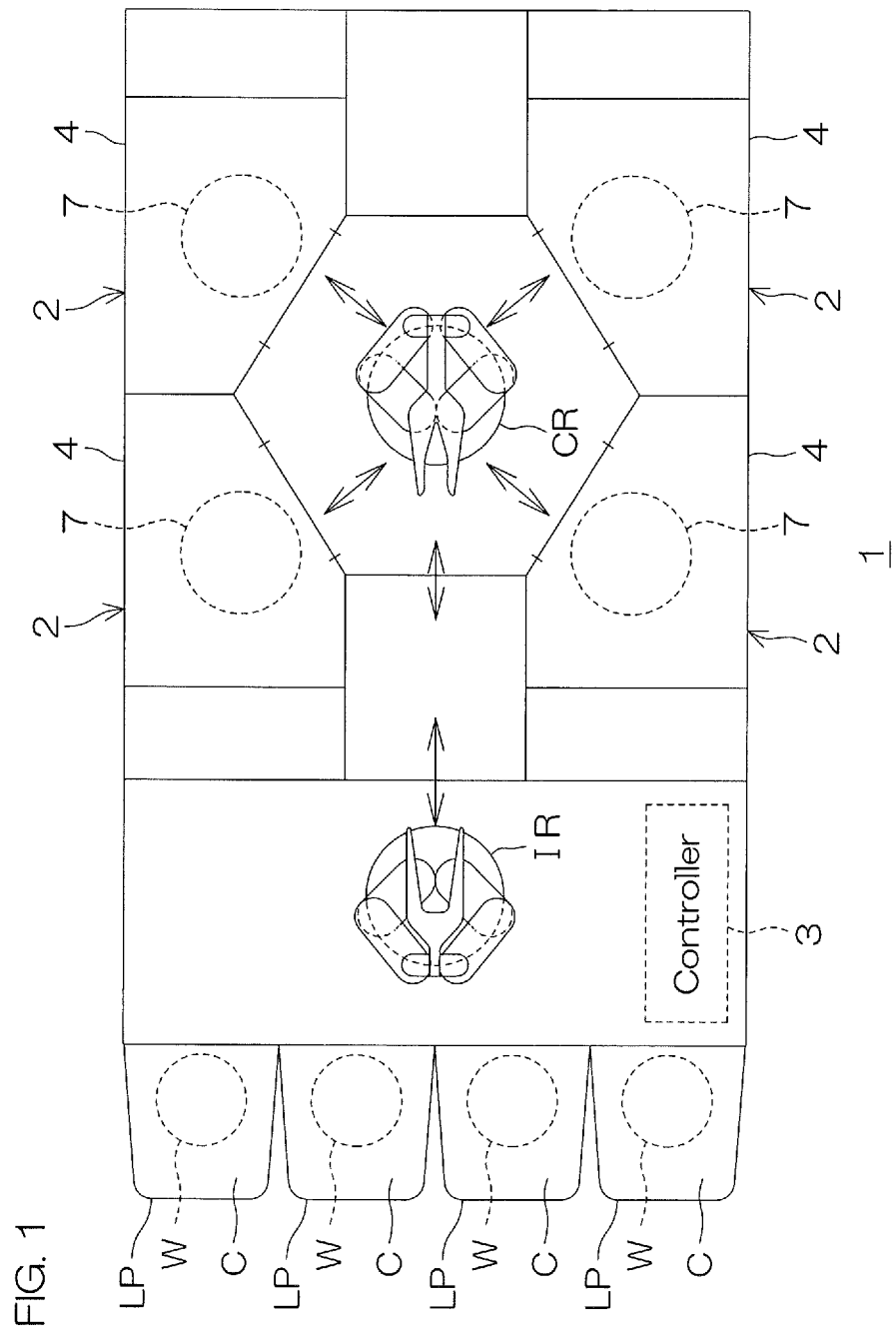
FIG. 1 is a schematic plan view which shows a layout of a substrate processing apparatus according to a preferred embodiment of the present invention.

FIG. 1 is a schematic plan view which shows a layout of a substrate processing apparatus 1 according to a preferred embodiment of the present invention.

The substrate processing apparatus 1 is a single substrate processing type apparatus that processes a substrate W such as a silicon wafer, etc., one at a time. In the preferred embodiment, the substrate W is a disk-shaped substrate.

The substrate processing apparatus 1 includes a plurality of processing units 2 for processing substrates W with fluids, load ports LP on which carriers C are placed that house the plurality of substrates W to be processed by the processing unit 2, transfer robots IR and CR that transfer the substrates W between the load port LP and the processing unit 2, and a controller 3 that controls the substrate processing apparatus 1.

The transfer robot IR transfers the substrates W between the carrier C and the transfer robot CR. The transfer robot CR transfers the substrates W between the transfer robot IR and the processing unit 2. The plurality of processing units 2 have, for example, the same configuration. Although the details will be described later, processing fluids supplied to the substrate W inside the processing unit 2 include a rinse liquid, a processing liquid, a removing liquid, a processing film residue removing liquid, a heating medium, an inert gas, etc.

Each processing unit 2 includes a chamber 4 and a processing cup 7 disposed inside the chamber 4 and executes processing of the substrate W inside the processing cup 7. An inlet/outlet (not shown) for carrying in the substrate W and carrying out the substrate W by the transfer robot CR is formed at the chamber 4. The chamber 4 is provided with a shutter unit (not shown) for opening and closing the inlet/outlet.

Figure 2:
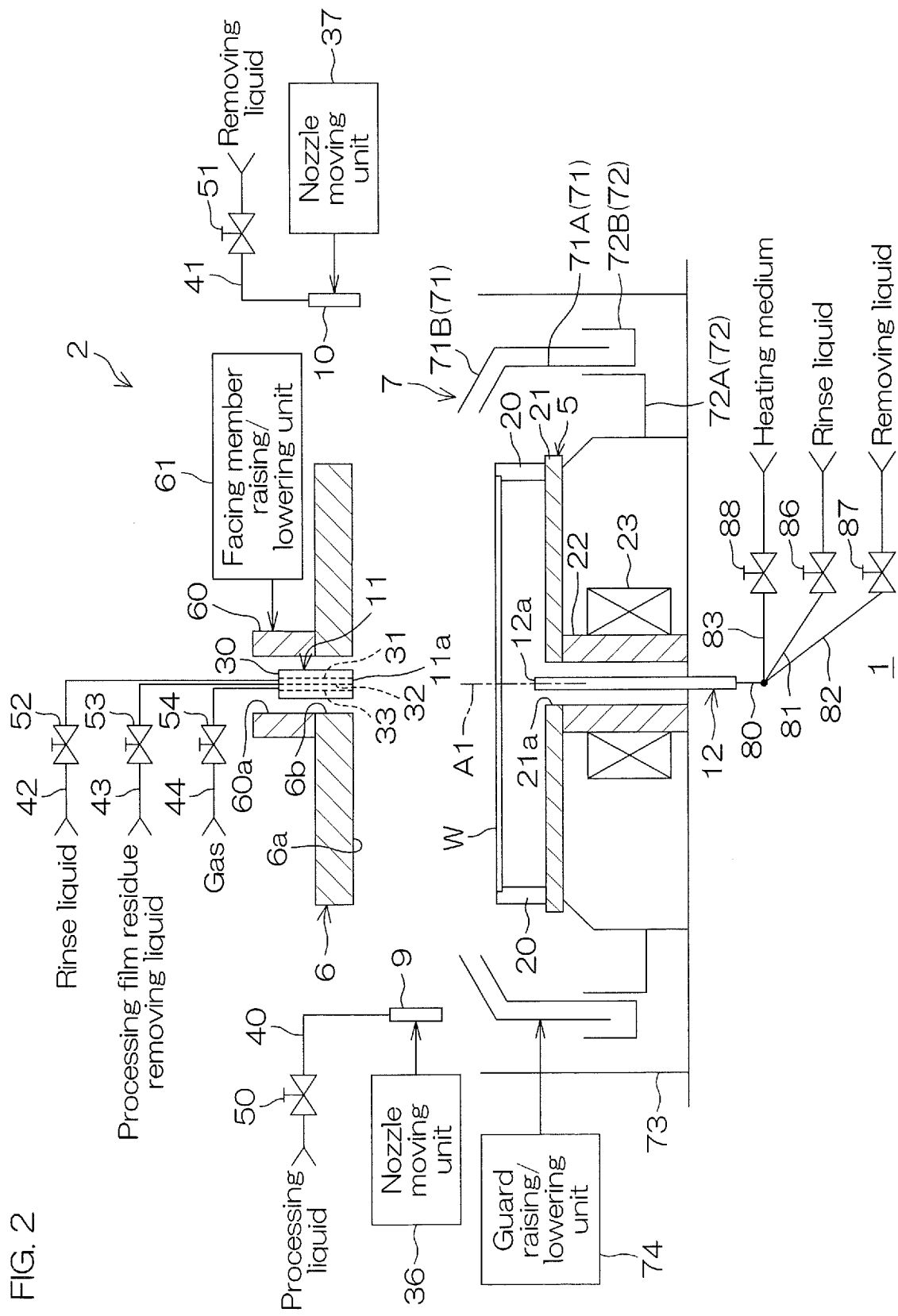
FIG. 2 is a schematic partial cross-sectional view which shows a general configuration of a processing unit included in the substrate processing apparatus.

FIG. 2 is a schematic view for describing an configuration example of the processing unit 2. The processing unit 2 includes a spin chuck 5, a facing member 6, a processing cup 7, a first moving nozzle 9, a second moving nozzle 10, a central nozzle 11, and a lower surface nozzle 12.

The spin chuck 5 rotates the substrate W around a vertical rotational axis A1 (vertical axis) passing through a central portion of the substrate W, while holding the substrate W horizontally. The spin chuck 5 includes a plurality of chuck pins 20, a spin base 21, a rotating shaft 22, and a spin motor 23.

The spin base 21 has a disk shape along a horizontal direction. On the upper surface of the spin base 21, the plurality of chuck pins 20 that grip a peripheral edge of the substrate W are disposed at intervals in a circumferential direction of the spin base 21. The spin base 21 and the plurality of chuck pins 20 constitute a substrate holding unit that holds the substrate W horizontally. The substrate holding unit is also referred to as a substrate holder.

The rotating shaft 22 extends in a vertical direction along the rotational axis A1. An upper end portion of the rotating shaft 22 is coupled to a lower surface center of the spin base 21. The spin motor 23 applies a rotational force to the rotating shaft 22. The spin base 21 is rotated by the rotating shaft 22 being rotated by the spin motor 23. The substrate W is thereby rotated around the rotational axis A1. The spin motor 23 is an example of a substrate rotating unit that rotates the substrate W around the rotational axis A1.

The facing member 6 faces the substrate W held by the spin chuck 5 from above. The facing member 6 is formed in a disk shape having substantially the same diameter or a diameter equal to or larger than that of the substrate W. The facing member 6 has a facing surface 6a that faces an upper surface (surface on the upper side) of the substrate W. The facing surface 6a is disposed substantially along a horizontal plane higher than the spin chuck 5.

A hollow shaft 60 is fixed to the facing member 6 at the opposite side to the facing surface 6a. A through hole 6b that penetrates up and down through the facing member 6 and is in communication with an internal space 60a of the hollow shaft 60 is formed in a portion of the facing member 6 that overlaps the rotational axis A1 in plan view.

The facing member 6 blocks an atmosphere inside a space between the facing surface 6a and the upper surface of the substrate W from an atmosphere outside the space. Therefore, the facing member 6 is also referred to as a blocking plate.

The processing unit 2 further includes a facing member raising/lowering unit 61 that drives raising and lowering of the facing member 6. The facing member raising/lowering unit 61 is capable of positioning the facing member 6 at any position (height) from a lower position to an upper position. The lower position is a position within a movable range of the facing member 6 at which the facing surface 6a is positioned most proximate to the substrate W. The upper position is a position within the movable range of the facing member 6 at which the facing surface 6a is separated farthest from the substrate W.

The facing member raising/lowering unit 61 includes, for example, a ball-screw mechanism (not shown) coupled to a supporting member (not shown) for supporting the hollow shaft 60 and an electric motor (not shown) which applies a driving force to the ball-screw mechanism. The facing member raising/lowering unit 61 is also referred to as a facing member lifter (blocking plate lifter).

The processing cup 7 includes a plurality of guards 71 that receive a liquid splashing outward from the substrate W held by the spin chuck 5, a plurality of cups 72 that receive a liquid guided downward by the plurality of guards 71, and a circular-cylindrical outer wall member 73 that surrounds the plurality of guards 71 and the plurality of cups 72.

In this preferred embodiment, there is shown an example in which two guards 71 (first guard 71A and second guard 71B) and two cups 72 (first cup 72A and second cup 72B) are provided.

The first cup 72A and the second cup 72B each have an annular groove shape which is opened upward.

The first guard 71A is disposed so as to surround the spin base 21. The second guard 71B is disposed so as to surround the spin base 21 in a rotational radial direction of the substrate W further outside than the first guard 71A.

The first guard 71A and the second guard 71B each have a substantially circular cylindrical shape, and an upper end portion of each of the guards 71 is inclined inward so as move toward the spin base 21.

The first cup 72A receives a liquid guided downward by the first guard 71A. The second cup 72B is formed integrally with the first guard 71A and receives a liquid guided downward by the second guard 71B.

The processing unit 2 includes a guard raising/lowering unit 74 which raises and lowers independently the first guard 71A and the second guard 71B. The guard raising/lowering unit 74 raises and lowers the first guard 71A between the lower position and the upper position. The guard raising/lowering unit 74 raises and lowers the second guard 71B between the lower position and the upper position.

When the first guard 71A and the second guard 71B are both positioned at the upper position, a liquid splashing from the substrate W is received by the first guard 71A. When the first guard 71A is positioned at the lower position and the second guard 71B is positioned at the upper position, a liquid splashing from the substrate W is received by the second guard 71B.

The guard raising/lowering unit 74 includes, for example, a first ball-screw mechanism (not shown) coupled to the first guard 71A, a first motor (not shown) which applies a driving force to the first ball-screw mechanism, a second ball-screw mechanism (not shown) coupled to the second guard 71B, and a second motor (not shown) which applies a driving force to the second ball-screw mechanism. The guard raising/lowering unit 74 is also referred to as a guard lifter.

The first moving nozzle 9 is an example of a processing liquid nozzle (processing liquid supplying unit) that supplies (discharges) a processing liquid toward the upper surface of the substrate W held by the spin chuck 5.

The first moving nozzle 9 is moved by the first nozzle moving unit 36 in a horizontal direction and in a vertical direction. The first moving nozzle 9 can move between a center position and a home position (retreat position) in the horizontal direction. When positioned at the center position, the first moving nozzle 9 faces the rotation center of the upper surface of the substrate W. The rotation center of the upper surface of the substrate W is a position that intersects the rotational axis A1 on the upper surface of the substrate W. When positioned at the home position, the first moving nozzle 9 does not face the upper surface of the substrate W and is positioned outside the processing cup 7 in plan view. By moving in the vertical direction, the first moving nozzle 9 can move close to the upper surface of the substrate W and retreat upward from the upper surface of the substrate W.

The first nozzle moving unit 36 includes, for example, a pivoting shaft (not shown) along the vertical direction, an arm (not shown) that is coupled to the pivoting shaft and extends horizontally, and a pivoting shaft driving unit (not shown) that raises, lowers and pivots the pivoting shaft.

The pivoting shaft driving unit moves the arm by pivoting the pivoting shaft around a vertical pivoting axis. Further, the pivoting shaft driving unit moves the arm up and down by raising and lowering the pivoting shaft along the vertical direction. The first moving nozzle 9 is fixed to the arm. The first moving nozzle 9 moves in the horizontal direction and the vertical direction in accordance with swinging and raising/lowering of the arm.

The first moving nozzle 9 is connected to a processing liquid piping 40 that guides a processing liquid. When a processing liquid valve 50 interposed in the processing liquid piping 40 is opened, the processing liquid is discharged continuously downward from the first moving nozzle 9.

The processing liquid discharged from the first moving nozzle 9 contains a solute and a solvent. The processing liquid is solidified or cured by at least partial volatilization (evaporation) of the solvent. The processing liquid is solidified or cured on the substrate W to form a processing film that holds removal objects such as particles, etc., present on the substrate W. The removal objects are, for example, foreign objects that adhere to the surface of the substrate W after dry etching or CMP.

Here, "solidified" means that a solute is hardened by the force, etc., acting between molecules and atoms, for example, along with volatilization of a solvent. "Cured" means that a solute is hardened by chemical changes, for example, polymerization, cross linkage, etc. Consequently, "solidified or cured" means that a solute is "hardened" due to various factors.

The solute contained in the processing liquid that is discharged from the first moving nozzle 9 includes a dissolution component, a low solubility component, a high solubility component, and a corrosion preventing component.

The dissolution component is a component which dissolves at least one of the front layer of the substrate W and the removal objects as a dissolution object. The front layer of the substrate W is a portion in the vicinity of the surface of the substrate W. The front layer of the substrate W after dry etching is formed of, for example, a Low-k film, TiN, $SiO_2$, Si, SiN, SiC, and Poly-Si. The front layer of the substrate W after CMP is formed of, for example, a metal, Si, $SiO_2$, SiC, GaN, etc. The metal which forms the front layer of the substrate W after CMP includes aluminum, tungsten, copper, cobalt, ruthenium, molybdenum, etc. The dissolution component is, for example, acid or alkali which dissolves the removal objects. The front layer of the substrate W may include a natural oxide film.

The corrosion preventing component is a component for preventing corrosion of metal. Therefore, where a metal layer is contained in the front layer of the substrate W, the corrosion preventing component is preferably contained in a solute that is contained in the processing liquid discharged from the first moving nozzle 9. As will be described later in detail, the corrosion preventing component is, for example, BTA (benzotriazole).

The low solubility component and the high solubility component may be such substances different from each other in solubility with respect to the removing liquid. The low solubility component contained in the processing liquid that is discharged from the first moving nozzle 9 is, for example, novolak. The high solubility component contained in the processing liquid that is discharged from the first moving nozzle 9 is, for example, 2,2-bis(4-hydroxyphenyl) propane.

The solvent contained in the processing liquid that is discharged from the first moving nozzle 9 may be any liquid which will dissolve the low solubility component, the high solubility component, the dissolution component, and the corrosion preventing component. The solvent contained in the processing liquid is preferably a liquid having compatibility (miscibility) with the removing liquid. Compatibility is a property that two types of liquids are dissolved and mixed with each other.

The solvent, the low solubility component, the high solubility component, the dissolution component, and the corrosion preventing component contained in the processing liquid that is discharged from the first moving nozzle 9 will be described later in detail.

The second moving nozzle 10 is an example of a removing liquid nozzle (removing liquid supplying unit) which continuously supplies (discharges) the removing liquid such as pure water toward the upper surface of the substrate W held by the spin chuck 5. The removing liquid is a liquid for removing a processing film in a state of holding the removal objects from the upper surface of the substrate W.

The second moving nozzle 10 is moved in the horizontal direction and the vertical direction by a second nozzle moving unit 37. The second moving nozzle 10 can move between the center position and the home position (retreat position) in the horizontal direction.

When positioned at the center position, the second moving nozzle 10 faces the rotation center of the upper surface of the substrate W. When positioned at the home position, the second moving nozzle 10 does not face the upper surface of the substrate W and is positioned outside the processing cup 7 in plan view. By moving in the vertical direction, the second moving nozzle 10 can move close to the upper surface of the substrate W and retreat upward from the upper surface of the substrate W.

The second nozzle moving unit 37 has the same configuration as the first nozzle moving unit 36. That is, the second nozzle moving unit 37 includes, for example, a pivoting shaft (not shown) along the vertical direction, an arm (not shown) that is coupled to the pivoting shaft and the second moving nozzle 10 and extends horizontally, and a pivoting shaft driving unit (not shown) that raises, lowers and pivots the pivoting shaft.

As the removing liquid discharged from the second moving nozzle 10, a liquid that is easier to dissolve the high solubility component contained in a solute of the processing liquid than a low solubility component contained in a solute of the processing liquid is used. The removing liquid that is discharged from the second moving nozzle 10 is, for example, pure water (preferably DIW). The removing liquid is not limited to pure water and may be an alkaline aqueous solution (alkaline liquid) or a neutral or acidic aqueous solution (non-alkaline aqueous solution). Specific examples of the alkaline aqueous solution include an ammonia solution, an SC1 solution, a TMAH (tetramethylammonium hydroxide) aqueous solution, a choline aqueous solution, and any combination of these.

The second moving nozzle 10 is connected to an upper removing liquid piping 41 which guides the removing liquid to the second moving nozzle 10. When an upper removing liquid valve 51 which is interposed in the upper removing liquid piping 41 is opened, the removing liquid is discharged downward continuously from a discharge port of the second moving nozzle 10.

The central nozzle 11 is housed in the internal space 60a of the hollow shaft 60 of the facing member 6. A discharge port 11a provided at a tip of the central nozzle 11 faces a central region of the upper surface of the substrate W from above. The central region of the upper surface of the substrate W is a region which includes the rotation center of the substrate W and the circumference thereof on the upper surface of the substrate W.

The central nozzle 11 includes a plurality of tubes (first tube 31, second tube 32, and third tube 33) which discharge a fluid downward and a tubular casing 30 which surrounds the plurality of tubes. The plurality of tubes and the casing 30 extend in an up/down direction along the rotational axis A1. The discharge port 11a of the central nozzle 11 is also a discharge port of the first tube 31, a discharge port of the second tube 32, and a discharge port of the third tube 33.

The first tube 31 (central nozzle 11) is an example of a rinse liquid supplying unit which supplies a rinse liquid such as DIW to the upper surface of the substrate W. The second tube 32 (central nozzle 11) is an example of an organic solvent supplying unit which supplies a processing film residue removing liquid such as IPA to the upper surface of the substrate W. The third tube 33 (central nozzle 11) is an example of a gas supplying unit which supplies a gas such as nitrogen gas between the upper surface of the substrate W and the facing surface 6a of the facing member 6.

The first tube 31 is connected to an upper rinse liquid piping 42 which guides the rinse liquid to the first tube 31. When an upper rinse liquid valve 52 that is interposed in the upper rinse liquid piping 42 is opened, the rinse liquid is discharged continuously from the first tube 31 (central nozzle 11) toward the central region on the upper surface of the substrate W.

The rinse liquid includes DIW, carbonated water, electrolyzed ion water, a hydrochloric acid aqueous solution of dilute concentration (of, for example, approximately 1 ppm to 100 ppm), an ammonia solution of dilute concentration (of, for example, approximately 1 ppm to 100 ppm), reduced water (hydrogen water), etc.

The second tube 32 is connected to a processing film residue removing liquid piping 43 which guides a processing film residue removing liquid to the second tube 32. When a processing film residue removing liquid valve 53 that is interposed in the processing film residue removing liquid piping 43 is opened, the processing film residue removing liquid is discharged continuously toward the central region on the upper surface of the substrate W from the second tube 32 (central nozzle 11).

The processing film residue removing liquid discharged from the second tube 32 is a liquid for removing residues of the processing film removed from the upper surface of the substrate W by the removing liquid. The processing film residue removing liquid is preferably a liquid that is higher in volatility than the rinse liquid. The processing film residue removing liquid discharged from the second tube 32 preferably has compatibility with the rinse liquid.

The processing film residue removing liquid that is discharged from the second tube 32 is, for example, an organic solvent. The organic solvent discharged from the second tube 32 includes a liquid which contains at least one of IPA, HFE (hydrofluoroether), methanol, ethanol, acetone, PGEE (propylene glycol monoethyl ether), and trans-1,2-dichloroethylene.

Further, the organic solvent discharged from the second tube 32 does not have to be constituted of a single component alone but may be a liquid that is mixed with other components. For example, it may be a mixture solution of IPA and DIW or a mixture solution of IPA and HFE.

The third tube 33 is connected to a gas piping 44 that guides a gas to the third tube 33. When a gas valve 54 that is interposed in the gas piping 44 is opened, the gas is discharged downward continuously from the third tube 33 (central nozzle 11).

The gas discharged from the third tube 33 is, for example, an inert gas such as nitrogen gas ($N_2$). The gas discharged from the third tube 33 may be air. The inert gas is not limited to nitrogen gas and is a gas which is inert to the upper surface of the substrate W or a pattern formed on the upper surface of the substrate W. The inert gas includes, for example, rare gases such as argon, in addition to nitrogen gas.

The lower surface nozzle 12 is inserted into a through hole 21a which is opened at an upper surface central portion of the spin base 21. The discharge port 12a of the lower surface nozzle 12 is exposed from an upper surface of the spin base 21. The discharge port 12a of the lower surface nozzle 12 faces a central region on a lower surface (surface on the lower side) of the substrate W from below. The central region of the lower surface of the substrate W is a region which includes the rotation center of the substrate W on the lower surface of the substrate W.

One end of a common piping 80 which guides a rinse liquid, a removing liquid, and a heating medium in common to the lower surface nozzle 12 is connected to the lower surface nozzle 12. To the other end of the common piping 80, a lower rinse liquid piping 81 which guides the rinse liquid to the common piping 80, a lower removing liquid piping 82 which guides the removing liquid to the common piping 80, and a heating medium piping 83 which guides the heating medium to the common piping 80 are connected.

When a lower rinse liquid valve 86 that is interposed in the lower rinse liquid piping 81 is opened, the rinse liquid is discharged continuously from the lower surface nozzle 12 toward the central region of the lower surface of the substrate W. When a lower removing liquid valve 87 that is interposed in the lower removing liquid piping 82 is opened, the removing liquid is discharged continuously from the lower surface nozzle 12 toward the central region of the lower surface of the substrate W. When a heating medium valve 88 that is interposed in the heating medium piping 83 is opened, the heating medium is discharged continuously from the lower surface nozzle 12 to the central region of the lower surface of the substrate W.

The lower surface nozzle 12 is an example of a lower rinse liquid supplying unit which supplies the rinse liquid to the lower surface of the substrate W. The lower surface nozzle 12 is also an example of a lower removing liquid supplying unit which supplies the removing liquid to the lower surface of the substrate W. Further, the lower surface nozzle 12 is an example of a heating medium supplying unit which supplies the heating medium for heating the substrate W to the substrate W. The lower surface nozzle 12 is also a substrate heating unit for heating the substrate W.

The heating medium discharged from the lower surface nozzle 12 is, for example, high temperature DIW, the temperature of which is higher than room temperature and lower than a boiling point of a solvent contained in the processing liquid. Where the solvent contained in the processing liquid is IPA, DIW with a temperature of 60° C. to 80° C. is, for example, used as the heating medium. The heating medium discharged from the lower surface nozzle 12 is not limited to high temperature DIW and may be a high temperature inert gas, the temperature of which is higher than room temperature and lower than a boiling point of the solvent contained in the processing liquid or a high temperature gas such as high temperature air, etc.

Figure 3:
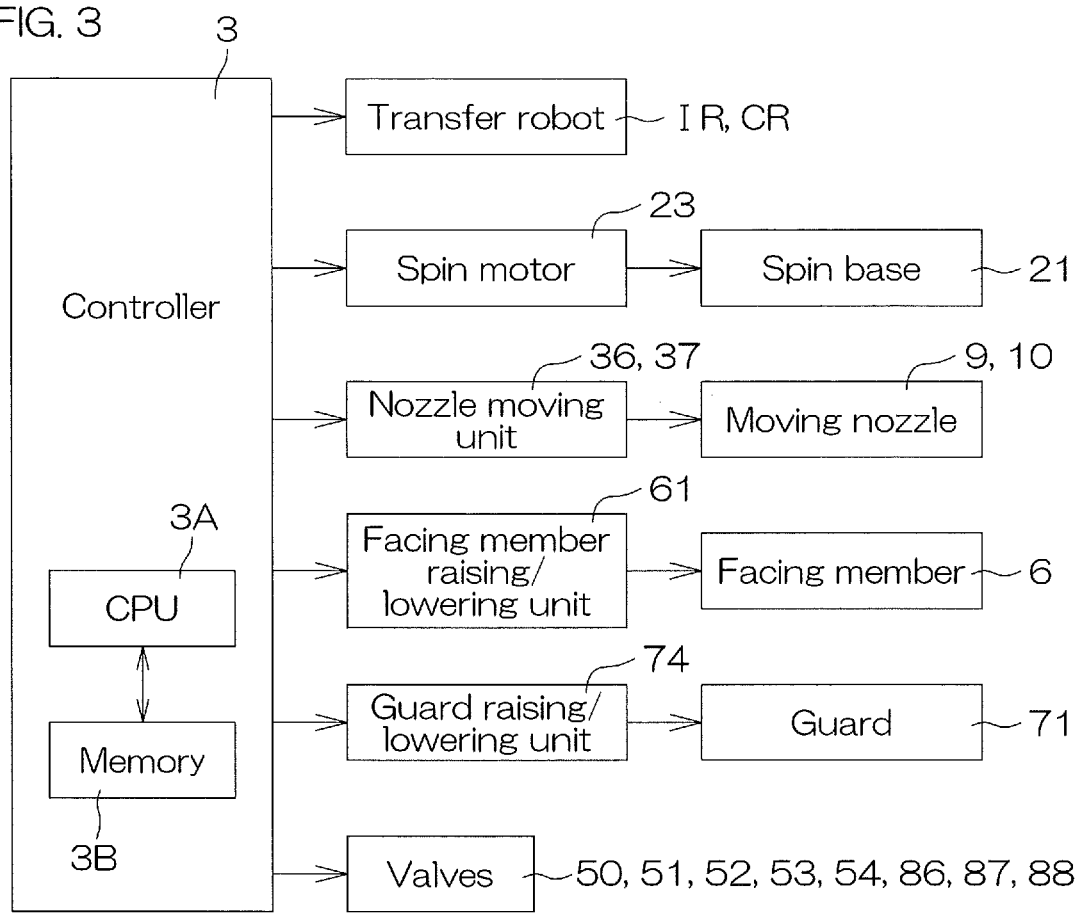
FIG. 3 is a block diagram which shows an electrical configuration of a main portion of the substrate processing apparatus.

FIG. 3 is a block diagram which shows an electrical configuration of the main portion of the substrate processing apparatus 1. The controller 3 is provided with a microcomputer and controls control objects installed in the substrate processing apparatus 1 according to a predetermined control program.

Specifically, the controller 3 includes a processor (CPU) 3A and a memory 3B in which control programs are housed. The controller 3 is configured so as to execute various types of control for substrate processing in accordance with execution of the control programs by the processor 3A.

The controller 3 is programmed so as to control, in particular, the transfer robots IR, CR, the spin motor 23, the first nozzle moving unit 36, the second nozzle moving unit 37, the facing member raising/lowering unit 61, the guard raising/lowering unit 74, the processing liquid valve 50, the upper removing liquid valve 51, the upper rinse liquid valve 52, the processing film residue removing liquid valve 53, the gas valve 54, the lower rinse liquid valve 86, the lower removing liquid valve 87, and the heating medium valve 88. The valves are controlled by the controller 3 so as to control whether a processing fluid from a corresponding nozzle is discharged or not and at which flow rate the processing fluid from the corresponding nozzle is discharged.

<Example of Substrate Processing>

Figure 4:
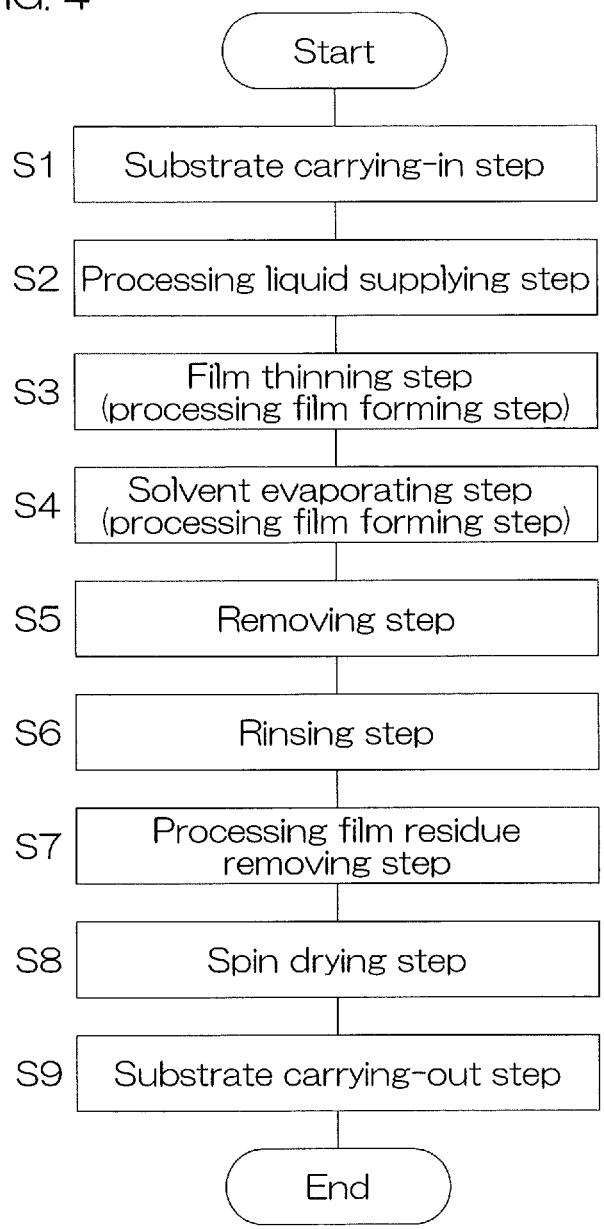
FIG. 4 is a flowchart for describing an example of substrate processing by the substrate processing apparatus.

FIG. 4 is a flowchart for describing one example of substrate processing by the substrate processing apparatus 1. FIG. 4 mainly shows the processing which is obtained by execution of the programs by the controller 3. FIG. 5A to FIG. 5H are each a schematic view for describing conditions of each step of the substrate processing.

In the substrate processing by the substrate processing apparatus 1, for example, as shown in FIG. 4, the substrate carrying-in step (Step S1), the processing liquid supplying step (Step S2), the film thinning step (Step S3), the solvent evaporating step (Step S4), the removing step (Step S5), the rinsing step (Step S6), the processing film residue removing step (Step S7), the spin drying step (Step S8), and the substrate carrying-out step (Step S9) are executed in this order.

First, a substrate W which is not processed is carried in the processing unit 2 from the carrier C by the transfer robots IR, CR (refer to FIG. 1) and transferred to the spin chuck 5 (Step S1). Thereby, the substrate W is horizontally held by the spin chuck 5 (substrate holding step). When the substrate W is carried in, the facing member 6 is retreated to the upper position.

The substrate W is held continuously by the spin chuck 5 until completion of the spin drying step (Step S8). The guard raising/lowering unit 74 adjusts the height position of the first guard 71A and that of the second guard 71B so that at least one of the guards 71 is positioned at the upper position from the start of the substrate holding step to the completion of the spin drying step (Step S8).

Next, after the transfer robot CR is retreated to the outside of the processing unit 2, the processing liquid supplying step (Step S2) is started. In the processing liquid supplying step, first, the spin motor 23 rotates the spin base 21. Thereby, the substrate W that is held horizontally is rotated (substrate rotating step).

Figure 5A:
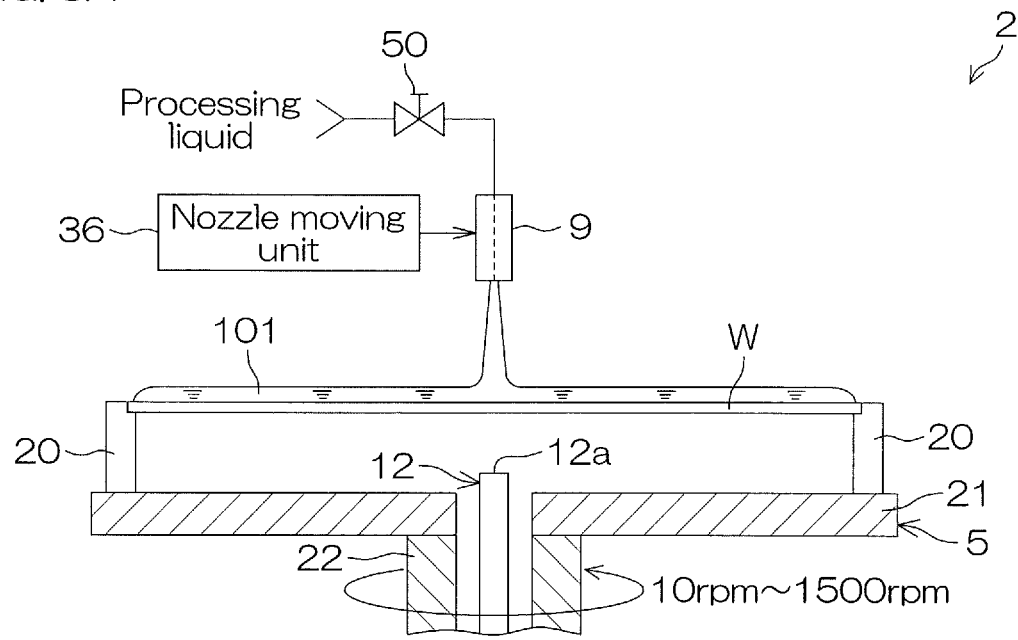
FIG. 5A is a schematic view for describing conditions of a processing liquid supplying step (Step S2) of the substrate processing.

In a state that the facing member 6 is positioned at the upper position, the first nozzle moving unit 36 moves the first moving nozzle 9 to a processing position. The processing position of the first moving nozzle 9 is, for example, a central position. Then, the processing liquid valve 50 is opened. Thereby, as shown in FIG. 5A, the processing liquid is supplied (discharged) from the first moving nozzle 9 toward the central region of the upper surface of the substrate W in a rotating state (processing liquid supplying step, processing liquid discharging step). Thereby, a liquid film 101 (processing liquid film) of the processing liquid is formed on the substrate W (processing liquid film forming step). At least one of the removal objects present on the upper surface of the substrate W and the front layer of the substrate W is partially dissolved by a dissolution component contained in the processing liquid (dissolution step).

Supply of the processing liquid from the first moving nozzle 9 continues for a predetermined time of, for example, 2 to 4 seconds. In the processing liquid supplying step, the substrate W is rotated at a predetermined processing liquid rotational speed of, for example, 10 rpm to 1500 rpm.

Next, the processing film forming step (Step S3 and Step S4) is executed. In the processing film forming step, the processing liquid on the substrate W is solidified or cured to form on the upper surface of the substrate W a processing film 100 (refer to FIG. 5D) that holds the removal objects present on the substrate W.

In the processing film forming step, first, the film thinning step (spin-off step) (Step S3) which reduces the thickness of the liquid film 101 of the processing liquid on the substrate W is executed. Specifically, the processing liquid valve 50 is closed. Thereby, supply of the processing liquid to the substrate W is stopped. Then, the first moving nozzle 9 is moved to the home position by the first nozzle moving unit 36.

Figure 5B:
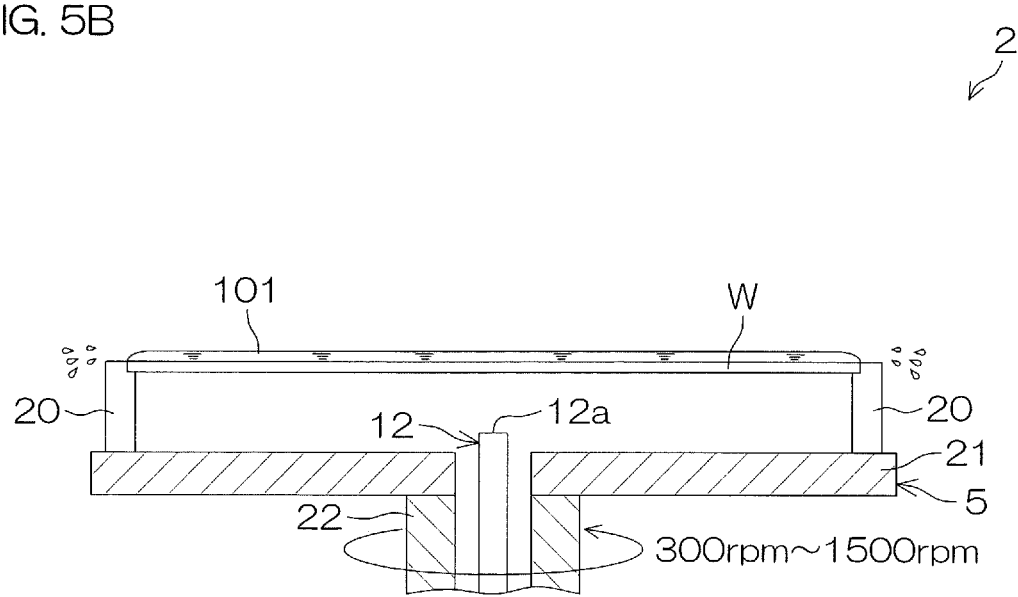
FIG. 5B is a schematic view for describing conditions of a film thinning step (Step S3) of the substrate processing.

As shown in FIG. 5B, in the film thinning step, the processing liquid is partially removed from the upper surface of the substrate W by a centrifugal force in a state that supply of the processing liquid to the upper surface of the substrate W is stopped so that the liquid film 101 on the substrate W can be made appropriate in thickness.

Even after the first moving nozzle 9 has moved to the home position, the facing member 6 is maintained at the upper position.

In the film thinning step, the spin motor 23 changes the rotational speed of the substrate W to a predetermined film thinning speed. The film thinning speed is, for example, 300 rpm to 1500 rpm. The rotational speed of the substrate W may be kept at a fixed speed in a range of 300 rpm to 1500 rpm or may be changed whenever necessary in a range of 300 rpm to 1500 rpm while the film thinning step. The film thinning step is executed for a predetermined time of, for example, 30 seconds.

In the processing film forming step, after the film thinning step, the solvent evaporating step (Step 4) in which a solvent is partially evaporated (volatilized) from the liquid film 101 of the processing liquid is executed. In the solvent evaporating step, in order to evaporate a part of the solvent of the processing liquid on the substrate W, the liquid film 101 on the substrate W is heated.

Figure 5C:
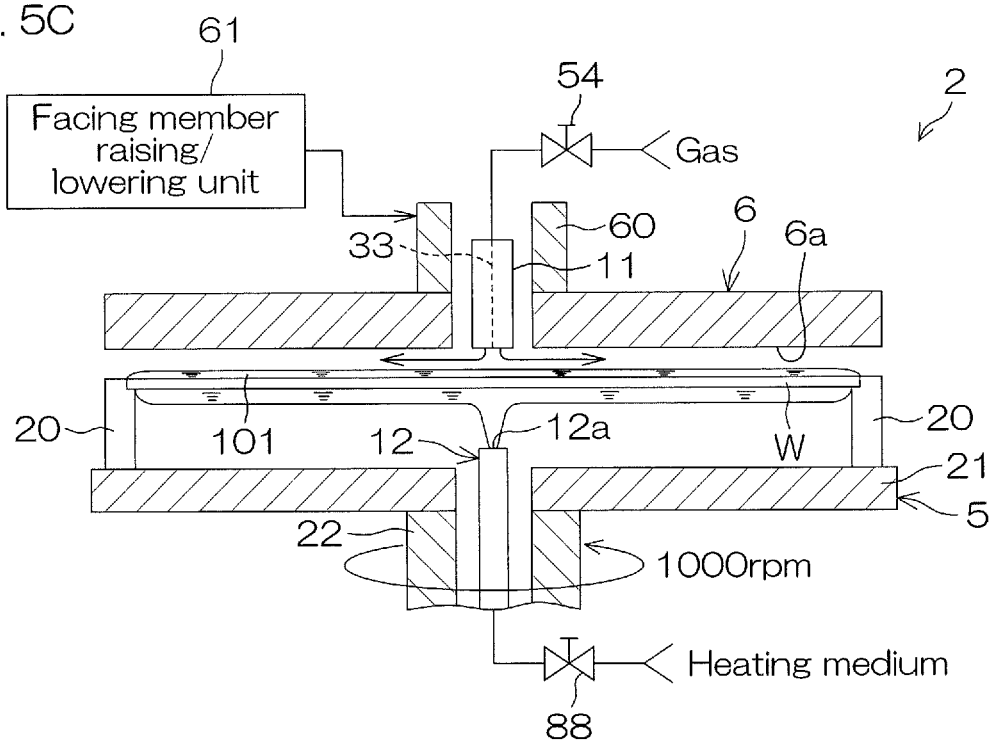
FIG. 5C is a schematic view for describing conditions of a solvent evaporating step (Step S4) of the substrate processing.

Specifically, as shown in FIG. 5C, the facing member raising/lowering unit 61 moves the facing member 6 to a proximate position between the upper position and the lower position. The proximate position may be the lower position. The proximate position is a position at which the distance from the upper surface of the substrate W to the facing surface 6a is, for example, 1 mm.

Then, the gas valve 54 is opened. Thereby, a gas is supplied to the space between the upper surface of the substrate W (upper surface of the liquid film 101) and the facing surface 6a of the facing member 6 (gas supplying step).

The gas is sprayed to the liquid film 101 on the substrate W, thereby facilitating evaporation (volatilization) of the solvent in the liquid film 101 (solvent evaporating step, solvent evaporation facilitating step). Therefore, it is possible to shorten the time necessary for forming the processing film 100. The central nozzle 11 functions as an evaporation unit (evaporation facilitating unit) for evaporating the solvent in the processing liquid.

The heating medium valve 88 is also opened. Thereby, a heating medium is supplied (discharged) from the lower surface nozzle 12 toward the central region of the lower surface of the substrate W in a rotating state (heating medium supplying step, heating medium discharging step). The heating medium supplied from the lower surface nozzle 12 to the lower surface of the substrate W spreads radially by receiving a centrifugal force and spreads across the entire lower surface of the substrate W. Supply of the heating medium to the substrate W continues for a predetermined time of, for example, 60 seconds. In the solvent evaporating step, the substrate W is rotated at a predetermined evaporation rotational speed of, for example, 1000 rpm.

The heating medium is supplied to the lower surface of the substrate W, by which the liquid film 101 on the substrate W is heated via the substrate W. Evaporation (volatilization) of the solvent in the liquid film 101 is thereby facilitated (solvent evaporating step, solvent evaporation facilitating step). Therefore, it is possible to shorten the time necessary for forming the processing film 100. The lower surface nozzle 12 functions as an evaporation unit (evaporation facilitating unit) for evaporating (volatilizing) the solvent in the processing liquid.

Figure 5D:
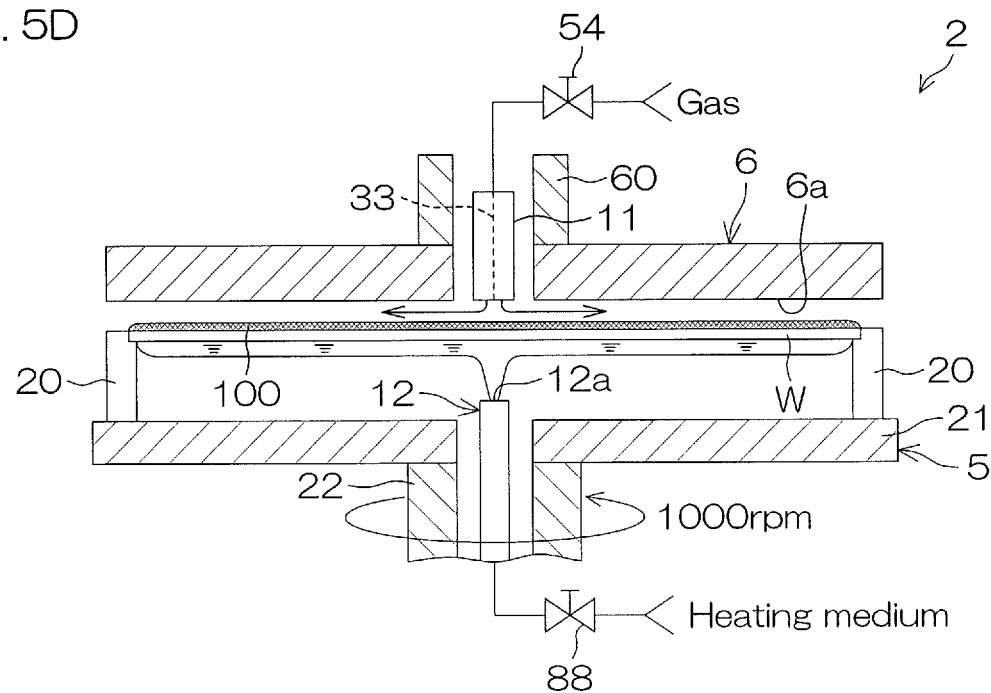
FIG. 5D is a schematic view for describing conditions of the solvent evaporating step (Step S4) of the substrate processing.

The film thinning step and the solvent evaporating step are executed, by which the processing liquid is solidified or cured to form the processing film 100 on the substrate W, as shown in FIG. 5D. Thus, the substrate rotating unit (spin motor 23), the central nozzle 11, and the lower surface nozzle 12 constitute a solid forming unit (processing film forming unit) which forms a solid (processing film 100) by solidifying or curing the processing liquid.

In the solvent evaporating step, preferably, the substrate W is heated so that the temperature of the processing liquid on the substrate W becomes lower than a boiling point of the solvent. The processing liquid is heated to a temperature lower than the boiling point of the solvent, by which the solvent can remain appropriately inside the processing film 100. Thereby, as compared with a case where no solvent remains inside the processing film 100, in the subsequent removing step, the removing liquid can be easily and evenly mixed with the processing film 100 by an interaction of the removing liquid with the solvent remaining inside the processing film 100.

Next, the removing step (Step S5) in which the processing film 100 is peeled and removed from the upper surface of the substrate W is executed. Specifically, the heating medium valve 88 is closed. Thereby, supply of the heating medium to the lower surface of the substrate W is stopped. The gas valve 54 is also closed. Supply of the gas to the space between the facing surface 6a of the facing member 6 and the upper surface of the substrate W is thereby stopped.

Then, the facing member raising/lowering unit 61 moves the facing member 6 to the upper position. In a state that the facing member 6 is positioned at the upper position, the second nozzle moving unit 37 moves the second moving nozzle 10 to a processing position. The processing position of the second moving nozzle 10 is, for example, the central position.

Figure 5E:
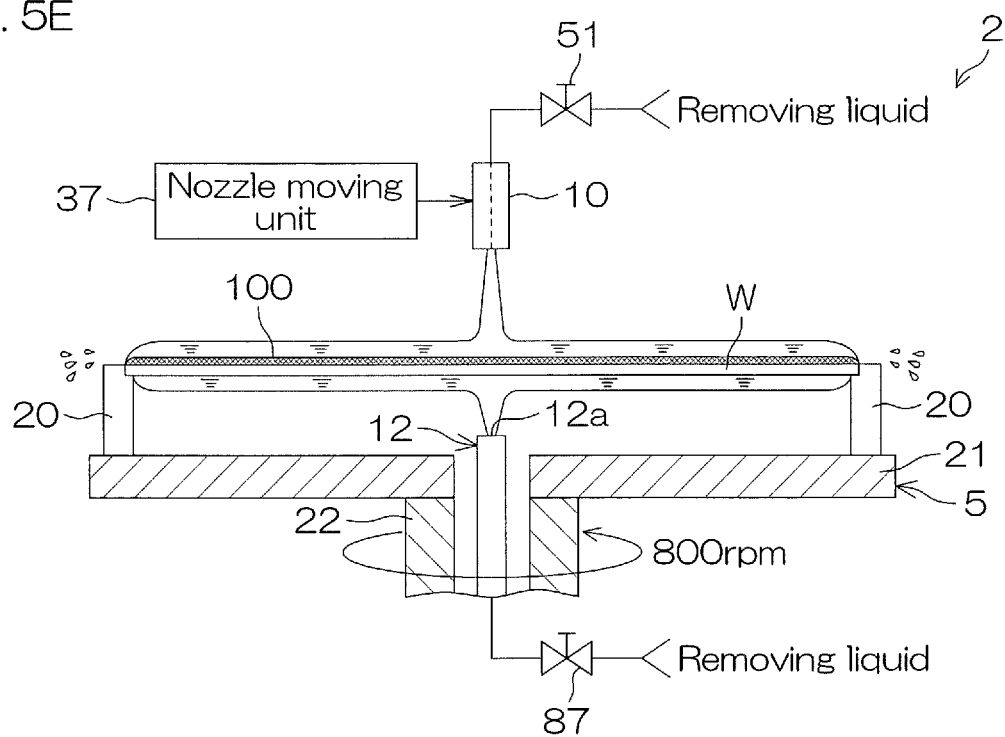
FIG. 5E is a schematic view for describing conditions of a removing step (Step S5) of the substrate processing.

Then, in a state that the second moving nozzle 10 is positioned at the processing position, the upper removing liquid valve 51 is opened. Thereby, as shown in FIG. 5E, the removing liquid is supplied (discharged) from the second moving nozzle 10 toward the central region of the upper surface of the substrate W in a rotating state (upper removing liquid supplying step, upper removing liquid discharging step). The removing liquid supplied to the upper surface of the substrate W spreads across the entire upper surface of the substrate W due to a centrifugal force. In the removing step, the substrate W is rotated at a predetermined removing rotational speed of, for example, 800 rpm.

At the same time the upper removing liquid valve 51 is opened, the lower removing liquid valve 87 is opened. Thereby, the removing liquid is supplied (discharged) from the lower surface nozzle 12 toward the central region of the lower surface of the substrate W in a rotating state (lower removing liquid supplying step, lower removing liquid discharging step). The removing liquid supplied to the lower surface of the substrate W spreads across the entire lower surface of the substrate W due to a centrifugal force.

The removing liquid is supplied to the upper surface of the substrate W, by which the processing film 100 is peeled from the upper surface of the substrate W together with removal objects due to peeling action of the removing liquid (peeling step). When peeled from the upper surface of the substrate W, the processing film 100 is split into film fragments. Then, supply of the removing liquid to the upper surface of the substrate W continues after peeling of the processing film 100, by which the split film fragments of the processing film 100 are removed to the outside of the substrate W together with the removing liquid. The film fragments of the processing film 100 in a state of holding the removal objects are thereby removed from the upper surface of the substrate W (removing step).

Here, in the processing liquid supplying step (Step S2) shown in FIG. 5A, there is a case in which the processing liquid supplied to the upper surface of the substrate W may flow along the peripheral edge of the substrate W and flow around the lower surface of the substrate W. There is also a case in which the processing liquid that has splashed from the substrate W may splash back from the guard 71 and adhere to the lower surface of the substrate W. Even in these cases, as shown in FIG. 5D, in the processing film forming step, the heating medium is supplied to the lower surface of the substrate W. It is, therefore, possible to remove the processing liquid from the lower surface of the substrate W by a flow of the heating medium.

Further, there is a case in which the processing liquid adhering to the lower surface of the substrate W due to the processing liquid supplying step (Step S2) may be solidified or cured and form a solid. Even in this case, as shown in FIG. 5E, in the removing step (Step S5), while the removing liquid is supplied to the upper surface of the substrate W, the removing liquid is supplied (discharged) to the lower surface of the substrate W from the lower surface nozzle 12. It is thereby possible to peel and remove the solid from the lower surface of the substrate W.

Figure 5F:
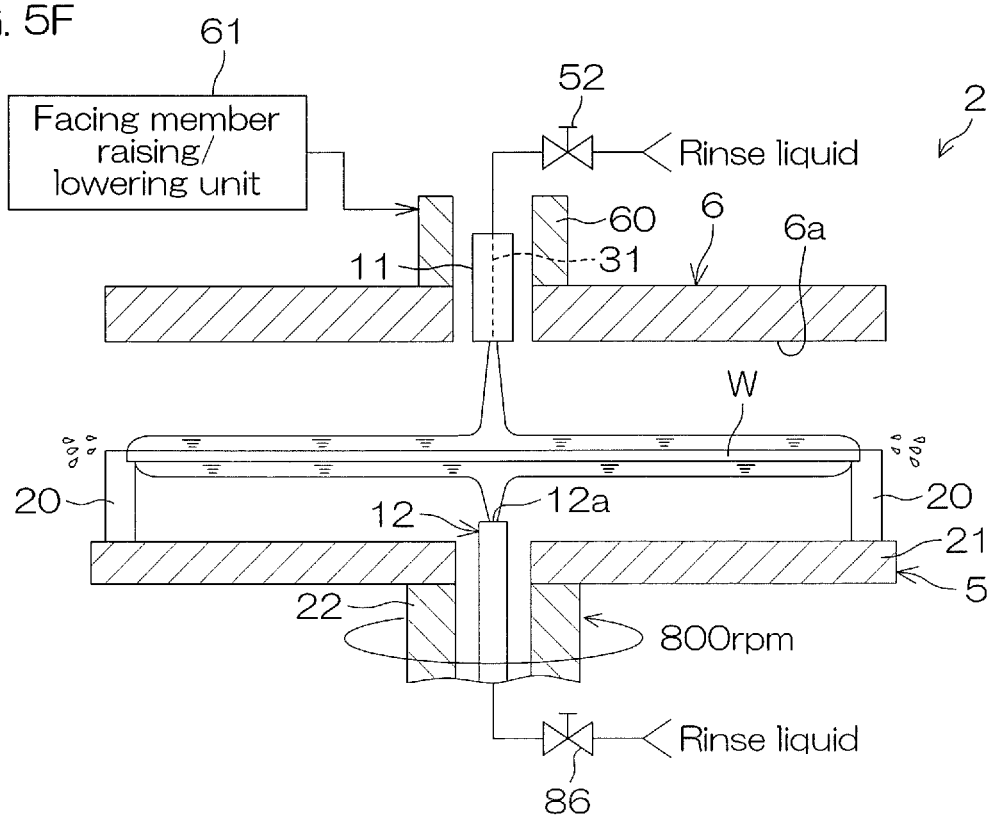
FIG. 5F is a schematic view for describing conditions of a rinsing step (Step S6) of the substrate processing.

After the removing step (Step S5), the rinsing step (Step S6) is executed. Specifically, the upper removing liquid valve 51 and the lower removing liquid valve 87 are closed. Thereby, supply of the removing liquid to the upper surface and the lower surface of the substrate W is stopped. Then, the second nozzle moving unit 37 moves the second moving nozzle 10 to the home position. Then, as shown in FIG. 5F, the facing member raising/lowering unit 61 moves the facing member 6 to the processing position. In the rinsing step, the substrate W is rotated at a predetermined rinsing rotational speed of, for example, 800 rpm. The processing position is a position which is spaced away further upward from the upper surface of the substrate W than the proximate position.

Then, in a state that the facing member 6 is positioned at the processing position, the upper rinse liquid valve 52 is opened. The rinse liquid is thereby supplied (discharged) from the central nozzle 11 toward the central region of the upper surface of the substrate W in a rotating state (upper rinse liquid supplying step, upper rinse liquid discharging step). The rinse liquid supplied to the upper surface of the substrate W spreads across the entire upper surface of the substrate W due to a centrifugal force. The removing liquid adhering to the upper surface of the substrate W is thereby rinsed by the rinse liquid.

Further, at the same time the upper rinse liquid valve 52 is opened, the lower rinse liquid valve 86 is opened. Thereby, the rinse liquid is supplied (discharged) from the lower surface nozzle 12 toward the central region of the lower surface of the substrate W in a rotating state (lower rinse liquid supplying step, lower rinse liquid discharging step). The removing liquid adhering to the lower surface of the substrate W is thereby rinsed by the rinse liquid. Supply of the rinse liquid to the upper surface and the lower surface of the substrate W continues for a predetermined time of, for example, 35 seconds.

Next, the processing film residue removing step (Step S7) is executed. Specifically, the upper rinse liquid valve 52 and the lower rinse liquid valve 86 are closed. Thereby, supply of the rinse liquid to the upper surface and the lower surface of the substrate W is stopped.

Figure 5G:
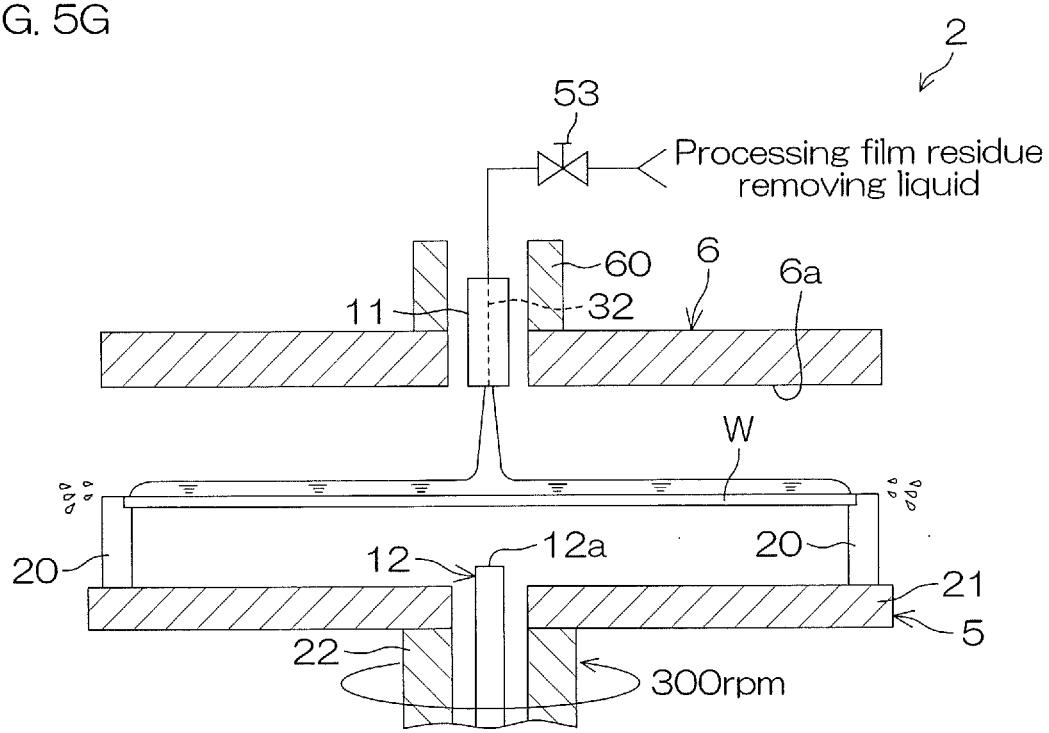
FIG. 5G is a schematic view for describing conditions of a processing film residue removing step (Step S7) of the substrate processing.

Then, in a state that the facing member 6 is positioned at the processing position, the processing film residue removing liquid valve 53 is opened. Thereby, as shown in FIG. 5G, the processing film residue removing liquid is supplied (discharged) from the central nozzle 11 toward the central region of the upper surface of the substrate W in a rotating state (processing film residue removing liquid supplying step, processing film residue removing liquid discharging step). Supply of the processing film residue removing liquid to the upper surface of the substrate W continues for a predetermined time of, for example, 30 seconds. In the processing film residue removing step, the substrate W is rotated at a predetermined residue removing rotational speed of, for example, 300 rpm.

The processing film residue removing liquid supplied to the upper surface of the substrate W spreads radially by receiving a centrifugal force and spreads across the entire upper surface of the substrate W. The rinse liquid on the upper surface of the substrate W is thereby replaced by the processing film residue removing liquid. The processing film residue removing liquid supplied to the upper surface of the substrate W dissolves the residues (processing film residues) of the processing film 100 remaining on the upper surface of the substrate W and, thereafter, is removed from the peripheral edge of the upper surface of the substrate W (processing film residue removing step).

Figure 5H:
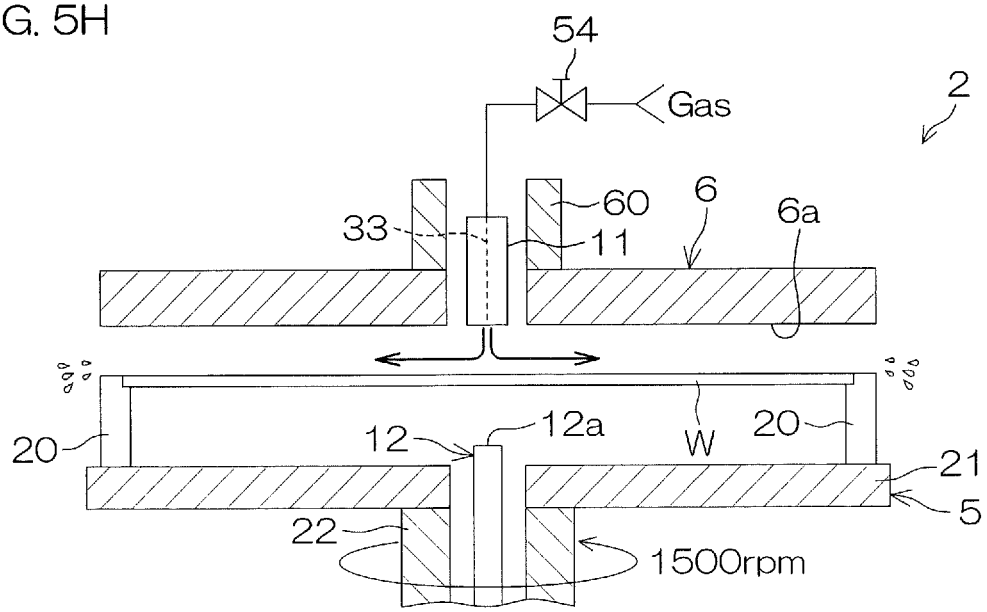
FIG. 5H is a schematic view for describing conditions of a spin drying step (Step S8) of the substrate processing.

Next, the spin drying step (Step S8) is executed. Specifically, the processing film residue removing liquid valve 53 is closed. Thereby, supply of the processing film residue removing liquid to the upper surface of the substrate W is stopped. Then, as shown in FIG. 5H, the facing member raising/lowering unit 61 moves the facing member 6 to a drying position which is lower than the processing position. When the facing member 6 is positioned at the drying position, the distance between the facing surface 6a of the facing member 6 and the upper surface of the substrate W is, for example, 1.5 mm. Then, the gas valve 54 is opened. A gas is thereby supplied to the space between the upper surface of the substrate W and the facing surface 6a of the facing member 6.

The spin motor 23 then accelerates the rotation of the substrate W to rotate the substrate W at a high speed. The substrate W in the spin drying step is rotated at a drying speed of, for example, 1500 rpm. The spin drying step is executed for a predetermined time of, for example, 30 seconds. A large centrifugal force thereby acts on the processing film residue removing liquid on the substrate W, and the processing film residue removing liquid on the substrate W is spun off to the circumference of the substrate W. In the spin drying step, a gas is supplied to the space between the upper surface of the substrate W and the facing surface 6a of the facing member 6 to facilitate evaporation of the processing film residue removing liquid.

The spin motor 23 then stops the rotation of the substrate W. The guard raising/lowering unit 74 moves the first guard 71A and the second guard 71B to the lower position. The gas valve 54 is closed. The facing member raising/lowering unit 61 then moves the facing member 6 to the upper position.

The transfer robot CR enters the processing unit 2, lifts up the processed substrate W from the chuck pin 20 of the spin chuck 5 and carries it to the outside of the processing unit 2 (Step S9). The substrate W is transferred from the transfer robot CR to the transfer robot IR and housed in the carrier C by the transfer robot IR.

In the spin drying step of the substrate processing, the upper surface of the substrate W is not dried by spinning off the rinse liquid such as DIW, etc., on the substrate W, but the rinse liquid on the substrate W is replaced by the processing film residue removing liquid such as IPA, etc., and thereafter the processing liquid residue removing liquid on the substrate W is spun off to dry the upper surface of the substrate W. That is, the spin drying step is executed after replacement by IPA lower in surface tension than DIW. It is therefore possible to reduce a surface tension that acts on an uneven pattern 160 (refer to FIG. 6) on the upper surface of the substrate W when the upper surface of the substrate W is dried.

<Configuration of Uneven Pattern of Substrate>

Figure 6:
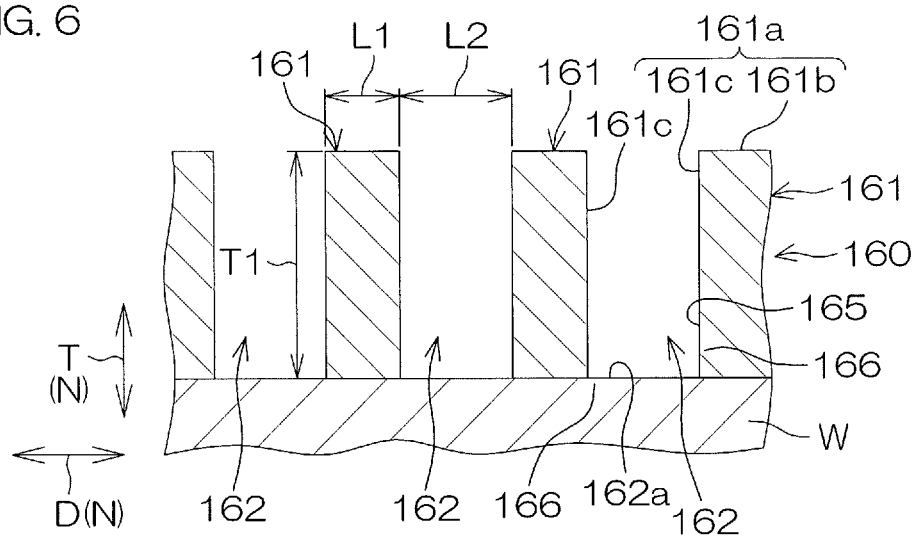
FIG. 6 is a schematic cross-sectional view for describing one example of a pattern surface structure of a substrate that is to be processed by the substrate processing apparatus.

As shown in FIG. 6, the fine uneven pattern 160 is formed on the upper surface of the substrate W to which the substrate processing is to be executed. The uneven pattern 160 includes a fine raised structure body 161 and a recessed portion (groove) 162 formed between adjacent structure bodies 161 which are formed on the upper surface of the substrate W.

A surface of the uneven pattern 160, that is, a surface of the structure body 161 (raised portion) and that of the recessed portion 162 form an irregular pattern surface 165. The pattern surface 165 is included in the upper surface of the substrate W. A surface 161a of the structure body 161 is constituted of a tip surface 161b (top) and a side surface 161c. The surface of the recessed portion 162 is constituted of a bottom surface 162a (bottom portion). Where the structure body 161 is tubular, the recessed portion is to be formed in its interior.

The front layer 166 of the substrate W is a portion of up to about 1 nm of the substrate W from the pattern surface 165 in a normal line direction N of the pattern surface 165. The portion of up to about 1 nm from the pattern surface 165 in the normal line direction N of the pattern surface 165 includes a portion of up to about 1 nm from the tip surface 161b of the structure body 161 in a thickness direction T of the substrate W, a portion of up to about 1 nm from the bottom surface of the recessed portion 162 in the thickness direction T, and a portion of up to about 1 nm from the side surface 161c of the structure body 161 in a direction D orthogonal to the thickness direction T.

The structure body 161 may include a resistor film or may include a conductor film. The structure body 161 may also be a laminated film for which a plurality of films are laminated.

The uneven pattern 160 is a fine pattern, the aspect ratio of which is 3 or more. The aspect ratio of the uneven pattern 160 is, for example, 10 to 50. A width L1 of the structure body 161 may be about 5 nm to 45 nm, and an interval L2 between the structure bodies 161 may be about 5 nm to several micrometers. A height (pattern height T1) of the structure body 161 may be, for example, about 50 nm to 5 μm. The pattern height T1 is a distance between the tip surface 161b of the structure body 161 and the bottom surface 162a (bottom portion) of the recessed portion 162.

<Details of Removal of Processing Film>

FIG. 7A to FIG. 8F are each a schematic view for describing conditions of the upper surface of the substrate during the substrate processing.

Conditions of the upper surface of the substrate W when removal objects are removed from the substrate W are different depending on the type of the removal objects present on the upper surface of the substrate W. The types of the removal objects present on the upper surface of the substrate W are different depending on the type of processing applied to the upper surface of the substrate W before execution of the substrate processing according to the present preferred embodiment.

Figure 7A:
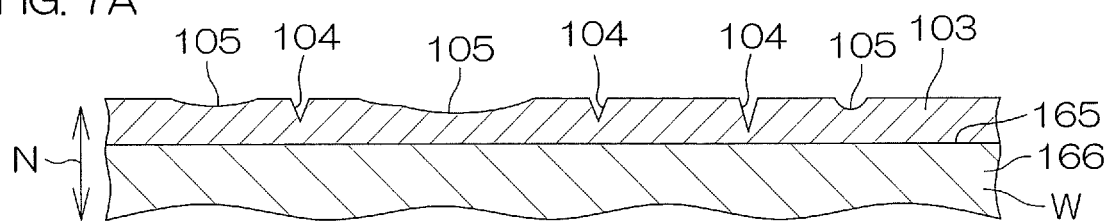
FIG. 7A is a schematic view for describing conditions of a surface of the substrate prior to the processing liquid supplying step of the substrate processing in a case where the substrate processing is performed by using a substrate which has been processed by dry etching.
Figure 8A:
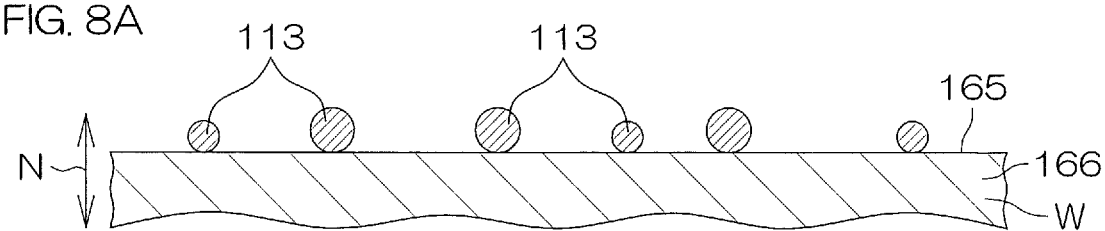
FIG. 8A is a schematic view for describing conditions of the surface of the substrate during the processing liquid supplying step of the substrate processing in a case where the substrate processing is performed by using a substrate which has been processed by CMP.

Specifically, where dry etching is executed before the substrate processing according to the present preferred embodiment, as shown in FIG. 7A, a film-like residue 103 (removal film) which covers at least a part of the surface of the substrate W is generated on the surface of the substrate W. That is, in this case, the film-like residue 103 is a removal object. On the other hand, where CMP is executed before the substrate processing according to the present preferred embodiment, as shown in FIG. 8A, spherical residues 113 are generated on the surface of the substrate W. That is, in this case, the spherical residues 113 are removal objects.

These removal objects are chemically bonded to the upper surface of the substrate W. "The removal objects are chemically bonded to the upper surface of the substrate W" refers to the fact that molecules or atoms which constitute the removal objects bond to molecules or atoms which constitute the front layer 166 of the substrate W by a covalent bond, an ionic bond, a metallic bond, etc.

First, with reference to FIG. 7A to FIG. 7E, conditions of the upper surface of the substrate where the substrate processing according to the present preferred embodiment is executed after dry etching will be described.

As shown in FIG. 7A, before start of the processing liquid supplying step, the pattern surface 165 of the substrate W is covered by the film-like residue 103. This film-like residue 103 is formed of, for example, a carbon-based film containing fluorine atoms expressed by $CF_x$ (X is a natural number of one or more), a fluorine resin, etc. The fluorine atoms in the carbon-based film are derived from a gas used in dry etching. The film-like residue 103 is not a film that is uniform in thickness, but a streak-like groove 104 is formed or the recessed portion 105 is formed so that the film-like residue 103 is partially reduced in thickness.

The film-like residue 103 and the front layer 166 of the substrate W are different from each other in material. Therefore, as a dissolution component contained in the processing liquid, a substance that will not dissolve the front layer 166 of the substrate W but will dissolve the film-like residue 103 can be selected. Here, such an example that the dissolution component contained in the processing liquid will not dissolve the front layer 166 of the substrate W but will dissolve the film-like residue 103 is described. That is, the film-like residue 103 (removal object) is the dissolution object.

Figure 7B:
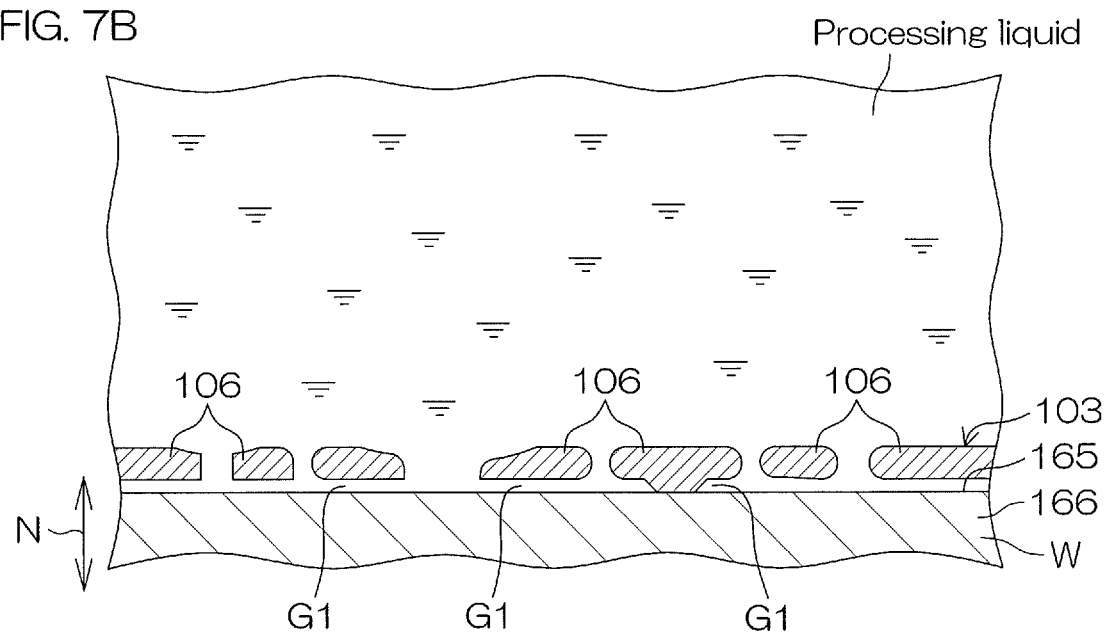
FIG. 7B is a schematic view for describing conditions of the surface of the substrate during the processing liquid supplying step of the substrate processing in a case where the substrate processing is performed by using the substrate which has been processed by dry etching.

When the processing liquid comes into contact with the film-like residue 103, the film-like residue 103 begins to be dissolved by the dissolution component in the processing liquid. Cracks occur at a portion of the film-like residue 103 at which the groove 104 or the recessed portion 105 is formed. The processing liquid reaches the pattern surface 165 of the substrate W through the cracks. With cracks occurring at the film-like residue 103 as a starting point, the film-like residue 103 is split to form film fragments (residual film fragments 106) of the film-like residue 103 as shown in FIG. 7B. The residual film fragments 106 are dissolved in the vicinity of a contact interface between the residual film fragments 106 and the pattern surface 165 of the substrate W by the processing liquid which has reached the pattern surface 165. A gap G1 is thereby formed between the pattern surface 165 of the substrate W and the residual film fragments 106, and the processing liquid enters the gap G1.

FIG. 7B shows such that the gap G1 is formed between all the residual film fragments 106 and the pattern surface 165. It is, however, not necessary to form the gap G1 between all the residual film fragments 106 and the pattern surface 165. The gap G1 may be formed between some of the residual film fragments 106 and the pattern surface 165.

Further, even where the gap G1 is formed between the residual film fragments 106 and the pattern surface 165, the residual film fragments 106 do not need to be completely lifted from the pattern surface 165. That is, even where the gap G1 is formed between the residual film fragments 106 and the pattern surface 165, there is also a case in which the residual film fragments 106 are in contact with the pattern surface 165.

Figure 7C:
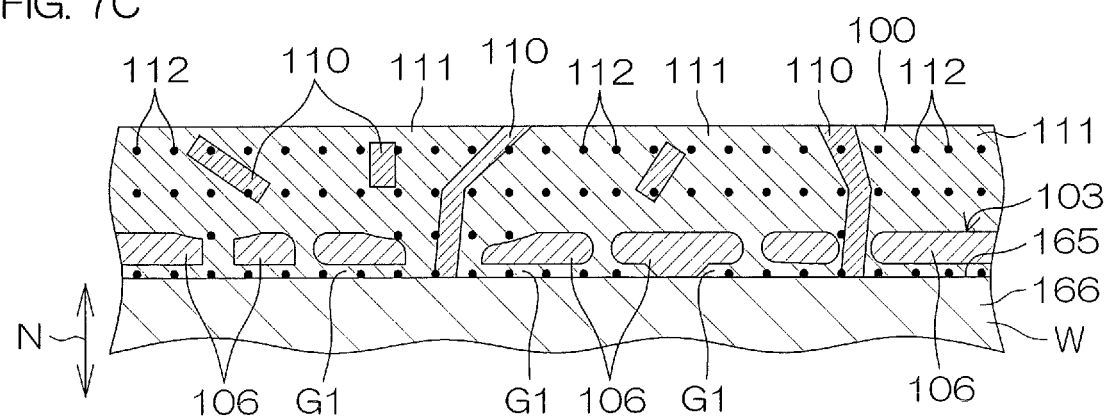
FIG. 7C is a schematic view for describing conditions of the surface of the substrate after the solvent evaporating step of the substrate processing in a case where the substrate processing is performed by using the substrate which has been processed by dry etching.

As shown in FIG. 7C, in the processing film forming step, the processing liquid is solidified or cured by evaporation of the solvent to form the processing film 100. The processing film 100 is formed in a state that the processing liquid has entered between the upper surface of the substrate W and the residual film fragments 106. Therefore, the thus-formed processing film 100 surrounds the residual film fragments 106 and firmly holds them.

The processing film 100 contains a high solubility solid 110 (high solubility component in a solid state), a low solubility solid 111 (low solubility component in a solid state), and a dissolution component solid 112 (dissolution component in a solid state). The processing film 100 is divided into a portion where the high solubility solids 110 are locally present and a portion where the low solubility solids 111 are locally present. The dissolution component solids 112 are evenly formed all over the processing film 100.

It is noted that the processing film 100 does not need to be a solid that is free of a liquid but the processing film 100 which is solidified to an extent to maintain a certain shape will suffice. That is, the processing film may contain each of the components (high solubility component, low solubility component, and dissolution component) in a liquid state or may contain each of the components in a state of being dissolved in a solvent.

The dissolution component in the processing film 100 dissolves the film-like residue 103 with more difficulty than the dissolution component in the processing liquid. Therefore, the processing liquid is solidified or cured to suppress the progress of dissolution of the film-like residue 103 by the dissolution component (dissolution suppressing step).

Figure 7D:
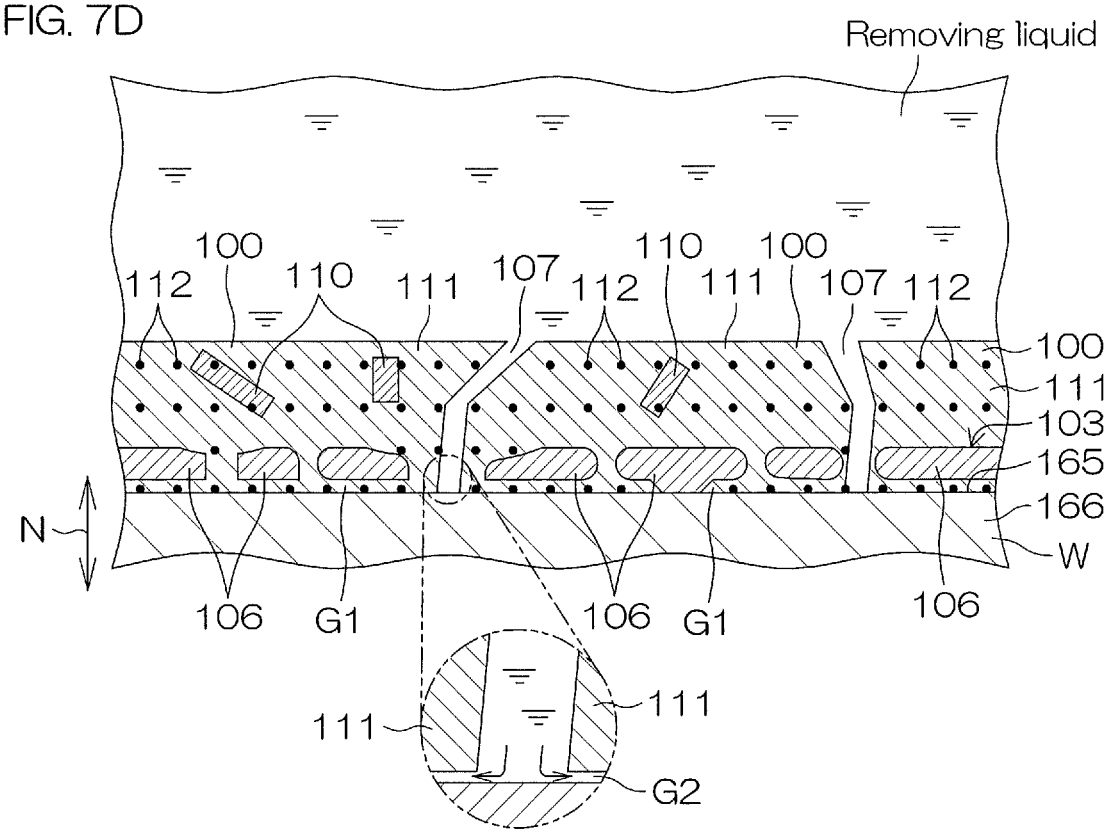
FIG. 7D is a schematic view for describing conditions of the surface of the substrate during the removing step of the substrate processing in a case where the substrate processing is performed by using the substrate which has been processed by dry etching.

As shown in FIG. 7D, in the removing step, the processing film 100 is partially dissolved. When the removing liquid is supplied to the upper surface of the substrate W, the high solubility solid 110 formed by the high solubility component that is dissolved more easily in the removing liquid than the low solubility component is mainly dissolved. That is, the high solubility solid 110 is selectively dissolved.

"The high solubility solid 110 is selectively dissolved" does not mean that only the high solubility solid 110 is dissolved. "The high solubility solid 110 is selectively dissolved" means that although the low solubility solid 111 is also slightly dissolved, the high solubility solid 110 is mostly dissolved.

In detail, a through hole 107 is formed in a portion of the processing film 100 where the high solubility solids 110 are locally present (through-hole forming step). The through hole 107 is easily formed particularly in a portion where the high solubility solids 110 extend in a normal line direction N of the pattern surface 165. The through hole 107 has a size that is, for example, several nanometers in diameter in plan view.

The low solubility solid 111 may also be dissolved in the removing liquid. However, the low solubility component is lower in solubility with respect to the removing liquid than the high solubility component and, thus, the low solubility solid 111 is only slightly dissolved in the vicinity of the surface thereof by the removing liquid. Therefore, the removing liquid which has reached the vicinity of the upper surface of the substrate W via the through hole 107 slightly dissolves a portion of the low solubility solid 111 in the vicinity of the upper surface of the substrate W. Thereby, as shown in the enlarged view of FIG. 7D, while gradually dissolving the low solubility solid 111 in the vicinity of the upper surface of the substrate W, the removing liquid enters a gap G2 between the processing film 100 and the upper surface of the substrate W (removing liquid entry step).

Figure 7E:
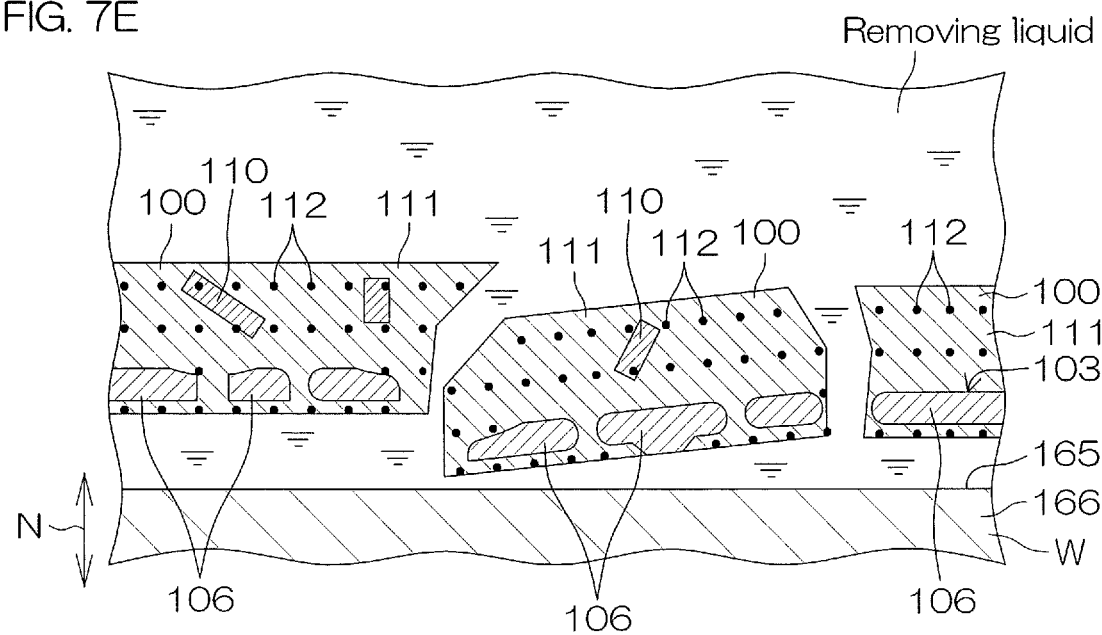
FIG. 7E is a schematic view for describing conditions of the surface of the substrate during the removing step of the substrate processing in a case where the substrate processing is performed by using the substrate which has been processed by dry etching.

Then, for example, with the peripheral edge of the through hole 107 as a starting point, the processing film 100 is split into film fragments. As shown in FIG. 7E, the film fragments of the processing film 100 are peeled from the substrate W in a state of holding the residual film fragments 106 (removal objects) (processing film splitting step, peeling step). Then, in a state of being held by the processing film 100, the residual film fragments 106 (removal objects) are pushed to the outside of the substrate W together with the processing film 100 and removed from the upper surface of the substrate W (removing step).

It is noted that there can be a case in which the removing liquid hardly dissolves the low solubility solid 111. Even in this case, the removing liquid enters the slight gap G2 between the processing film 100 and the upper surface of the substrate W to peel the processing film 100 from the substrate W.

According to an configuration that the substrate processing according to the present preferred embodiment is executed after dry etching, the film-like residue 103 (removal object) is partially dissolved by the dissolution component contained in the processing liquid. Therefore, the processing liquid supplying step is executed, by which the processing liquid easily enters between the film-like residue 103 and the upper surface of the substrate W. In the processing film forming step, if the processing liquid is solidified or cured in a state that the processing liquid has entered between the film-like residue 103 and the upper surface of the substrate W, a part of the processing film 100 is formed between the film-like residue 103 and the surface of the substrate W. Therefore, in the removing step, while holding the residual film fragments 106 (removal objects) with a sufficient holding force, the processing film 100 is removed from the upper surface of the substrate W by the removing liquid. As a result, the film-like residue 103 (removal object) can be efficiently removed from the upper surface of the substrate W.

Incidentally, unlike the substrate processing according to the present preferred embodiment, in a method that after supply of a dissolving liquid (for example, hydrofluoric acid) which contains a dissolution component to an upper surface of a substrate W, the dissolving liquid is rinsed by a rinse liquid and a processing liquid that contains no dissolution component is thereafter supplied to the substrate in order to form a processing film, the plurality of liquids are sequentially supplied to the upper surface of the substrate W. Therefore, every time the liquid is replaced on the substrate W, a turbulent flow is likely to occur around the film-like residue 103 (removal object). Further, when hydrofluoric acid is replaced by the rinse liquid, the liquid around the film-like residue 103 is changed from acidic to neutral. Due to the occurrence of the turbulent flow and the change in property of the liquid, the film-like residue 103 which has once separated from the upper surface of the substrate W by the dissolving liquid may reattach to the upper surface of the substrate W before being held by the processing film 100.

On the other hand, in the substrate processing method according to the present preferred embodiment, after supply of the processing liquid that contains the dissolution component to the upper surface of the substrate W, the processing film 100 is formed without replacement of the processing liquid by another liquid. Therefore, the processing film 100 can be quickly formed after the film-like residue 103 is partially dissolved. Consequently, while maintaining a state that the residual film fragments 106 (removal objects) are separated from the upper surface of the substrate W, the processing film 100 can be formed.

It is also possible to omit the step of supplying the dissolving liquid to the upper surface of the substrate W and the step of supplying the rinse liquid to the upper surface of the substrate W. Consequently, the time necessary for the substrate processing can be shortened.

Further, in this substrate processing, the processing liquid is solidified or cured to suppress the progress of dissolution of the film-like residue 103 by the dissolution component (dissolution suppressing step). It is therefore possible to avoid an excessive dissolution of the film-like residue 103 by the dissolution component.

Further, in this substrate processing, the solute in the processing liquid has a dissolution component, a high solubility component, and a low solubility component which is less likely to be dissolved in the removing liquid than the high solubility component. The processing film 100 has a high solubility solid 110, a low solubility solid 111, and a dissolution component solid 112. In the removing step, the high solubility solid 110 in the processing film 100 is selectively dissolved in the removing liquid.

Therefore, the high solubility solid 110 is dissolved in the removing liquid, thus the removing liquid can act on a contact interface between the processing film 100 and the substrate W. On the other hand, the low solubility component in the processing film 100 is maintained in a solid state without being dissolved. Consequently, while removal objects are held by the low solubility solid 111, the removing liquid can act on the contact interface between the low solubility solid 111 and the substrate W. As a result, it is possible to quickly remove the processing film 100 from the upper surface of the substrate W and efficiently remove the film-like residue 103 (removal object) together with the processing film 100 from the upper surface of the substrate W.

In this substrate processing, the film-like residue 103 (removal object) is chemically bonded to the upper surface of the substrate W. In order that the film-like residue 103 (removal object) held by the processing film 100 is separated from the upper surface of the substrate W, such a method is conceivable that the removing liquid is supplied at a great flow rate to the upper surface of the substrate W, thereby increasing a physical force (kinetic energy) acting on the film-like residue 103 from the removing liquid. However, where the film-like residue 103 is chemically bonded to the upper surface of the substrate W, the film-like residue 103 is held by the processing film 100, and it is therefore difficult to separate the film-like residue 103 from the upper surface of the substrate W by the physical force of the removing liquid alone, even if the physical force received from the moving liquid is increased.

Thus, like this substrate processing, if the film-like residue 103 is partially dissolved by the dissolution component contained in the processing liquid, the film-like residue 103 (residual film fragments 106) can be separated from the upper surface of the substrate W, irrespective of the bonding strength of the film-like residue 103 with the surface of the substrate W. Consequently, even where the film-like residue 103 is chemically bonded to the upper surface of the substrate W, the film-like residue 103 can be efficiently removed from the upper surface of the substrate W.

Further, in this substrate processing, the film-like residue 103 covers at least a part of the upper surface of the substrate. Unlike this substrate processing, where the processing film 100 is formed by a processing liquid that has no dissolution component, it is difficult for the processing liquid to enter between the film-like residue 103 and the pattern surface 165 of the substrate W.

However, in this substrate processing, the film-like residue 103 is partially dissolved by the dissolution component in the processing liquid. The gap G1 is thereby formed between the film-like residue 103 and the pattern surface 165 of the substrate W. Therefore, the processing liquid can enter between the film-like residue 103 and the pattern surface 165 of the substrate W.

Further, the film-like residue 103 is split by the dissolution component in the processing liquid. Therefore, the processing liquid can enter more efficiently between the residual film fragments 106 and the pattern surface 165 of the substrate W through a gap between the thus-split film fragments.

Next, with reference to FIG. 8A to FIG. 8F, conditions of the upper surface of the substrate W where the substrate processing according to the present preferred embodiment is executed after CMP will be described.

As shown in FIG. 8A, before the start of the processing liquid supplying step, for example, the spherical residues 113 adhere to the pattern surface 165 of the substrate W. The residue 113 is not limited to a spherical shape and may be in another shape, for example, an ellipsoid, etc.

The spherical residues 113 are, for example, of an abrasive agent used in CMP. Even if the spherical residues 113 are different in material from the front layer 166 of the substrate W, the front layer 166 of the substrate W is dissolved by the dissolution component to the same extent as the spherical residues 113. There is a case in which the material of the spherical residues 113 is the same as that of the front layer 166 of the substrate W. Consequently, where the substrate processing is performed after CMP, the front layer 166 of the substrate W and the spherical residues 113 (removal object) are dissolution objects.

Figure 8B:
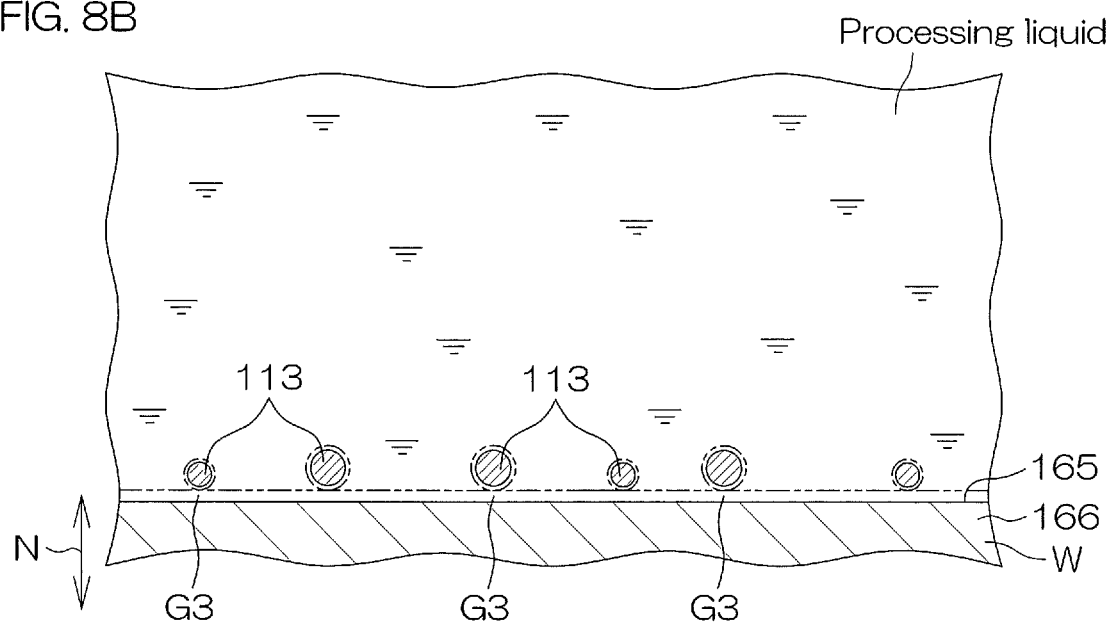
FIG. 8B is a schematic view for describing conditions of the surface of the substrate during the processing liquid supplying step of the substrate processing in a case where the substrate processing is performed by using the substrate which has been processed by CMP.

As shown in FIG. 8B, when the processing liquid comes into contact with the pattern surface 165 of the substrate W, the front layer 166 of the substrate W is partially dissolved by the dissolution component in the processing liquid. A portion of the spherical residue 113 in the vicinity of the surface thereof is also partially dissolved by contact with the processing liquid. Therefore, a gap G3 is formed between the pattern surface 165 of the substrate W and the spherical residue 113, and the processing liquid enters the gap G3.

Figure 8C:
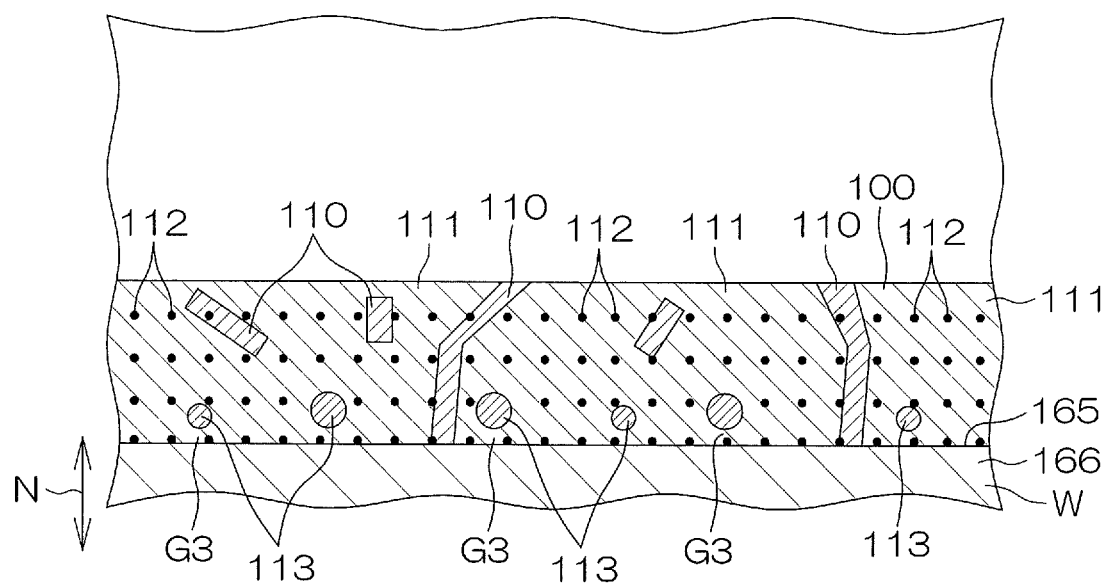
FIG. 8C is a schematic view for describing conditions of the surface of the substrate after the solvent evaporating step of the substrate processing in a case where the substrate processing is performed by using the substrate which has been processed by CMP.

As shown in FIG. 8C, in the processing film forming step, the processing liquid is solidified or cured by evaporation of the solvent to form the processing film 100. In a state that the processing liquid has entered into the gap G3 between the pattern surface 165 of the substrate W and the spherical residue 113, the processing film 100 is formed. Therefore, the thus-formed processing film 100 surrounds the spherical residues 113 and firmly holds them.

The processing film 100 contains a high solubility solid 110 (high solubility component in a solid state), a low solubility solid 111 (low solubility component in a solid state), and a dissolution component solid 112 (dissolution component in a solid state). The processing film 100 is divided into a portion where the high solubility solids 110 are locally present and a portion where the low solubility solids 111 are locally present. The dissolution component solids 112 are formed evenly all over the processing film 100.

It is noted that the processing film 100 does not need to be a solid that is free of a liquid but the processing film 100 which is solidified to an extent to maintain a certain shape will suffice. That is, the processing film may contain each of the components (high solubility component, low solubility component, and the dissolution component) in a liquid state or may contain each of the components in a state of being dissolved in the solvent.

The dissolution component in the processing film 100 dissolves the spherical residues 113 and the front layer 166 of the substrate W with more difficulty than the dissolution component in the processing liquid. Therefore, the processing liquid is solidified or cured to suppress the progress of dissolution of the spherical residues 113 and the front layer 166 of the substrate W by the dissolution component (dissolution suppressing step).

Figure 8D:
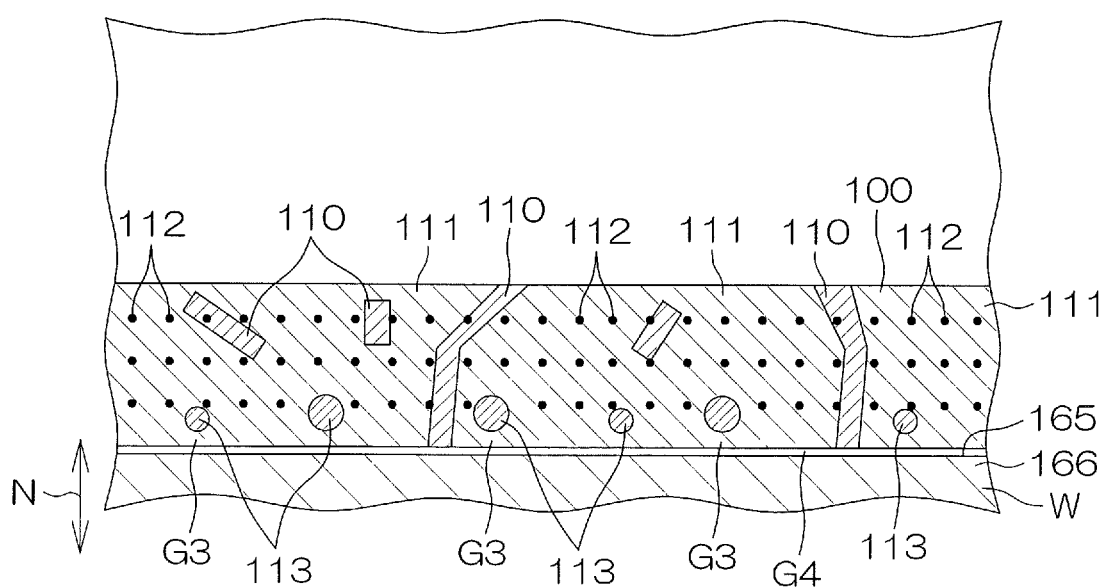
FIG. 8D is a schematic view for describing conditions of the surface of the substrate after the solvent evaporating step of the substrate processing in a case where the substrate processing is performed by using the substrate which has been processed by CMP.

Even after formation of the processing film 100, the processing film 100 is in contact with the pattern surface 165. The solvent slightly remains in the processing film 100. Therefore, the dissolution component dissolved in the solvent is also present in the processing film 100. As shown in FIG. 8D, the front layer 166 of the substrate W is therefore dissolved by the dissolution component in the processing film 100 in the vicinity of the contact interface between the processing film 100 and the substrate W. Therefore, the dissolution component in the processing film 100 in the vicinity of the contact interface between the processing film 100 and the substrate W is consumed.

Since the processing film 100 is formed by the processing liquid which is solidified or cured, the dissolution component is difficult to diffuse in the processing film 100. Consequently, dissolution of the front layer 166 of the substrate W by the dissolution component in the processing film 100 is suppressed along with the consumption of the dissolution component in the processing film 100 in the vicinity of the contact interface between the processing film 100 and the pattern surface 165 of the substrate W.

Dissolution of the front layer 166 of the substrate W by the dissolution component in the processing film 100 is suppressed to thereby form a gap G4 between the processing film 100 and the pattern surface 165 of the substrate W. Thereby, the contact area between the processing film 100 and the pattern surface 165 is decreased, so that the progress of dissolution of the front layer 166 of the substrate W by the dissolution component is suppressed.

Figure 8E:
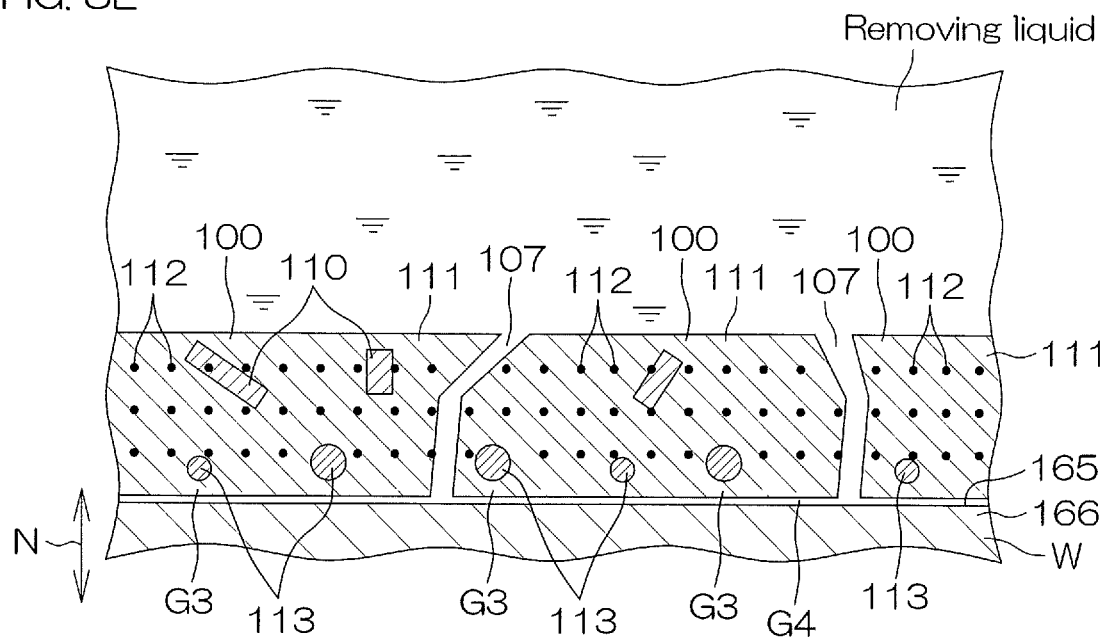
FIG. 8E is a schematic view for describing conditions of the surface of the substrate during the removing step of the substrate processing in a case where the substrate processing is performed by using the substrate which has been processed by CMP.

As shown in FIG. 8E, in the removing step, the processing film 100 is partially dissolved. When the removing liquid is supplied to the pattern surface 165 of the substrate W, the high solubility solid 110 formed by the high solubility component that is dissolved more easily in the removing liquid than the low solubility component is mainly dissolved. That is, the high solubility solid 110 is selectively dissolved.

In detail, the through hole 107 is formed in a portion of the processing film 100 where the high solubility solids 110 are locally present (through-hole forming step). The through hole 107 is easily formed particularly in a portion in which the high solubility solids 110 extend in a normal line direction N of the pattern surface 165. The through hole 107 has a size that is, for example, several nanometers in diameter in plan view.

The low solubility solid 111 may also be dissolved in the removing liquid. However, the low solubility solid 111 is less likely to be dissolved by the removing liquid than the high solubility solid 110. The low solubility solid 111 is only slightly dissolved in the vicinity of the pattern surface 165 thereof by the removing liquid. Therefore, the removing liquid which has reached the vicinity of the pattern surface 165 of the substrate W via the through hole 107 slightly dissolves a portion of the low solubility solid 111 in the vicinity of the pattern surface 165 of the substrate W. Thereby, while gradually dissolving the low solubility solid 111 in the vicinity of the pattern surface 165 of the substrate W, the removing liquid enters the gap G4 between the processing film 100 and the pattern surface 165 of the substrate W (removing liquid entry step).

Figure 8F:
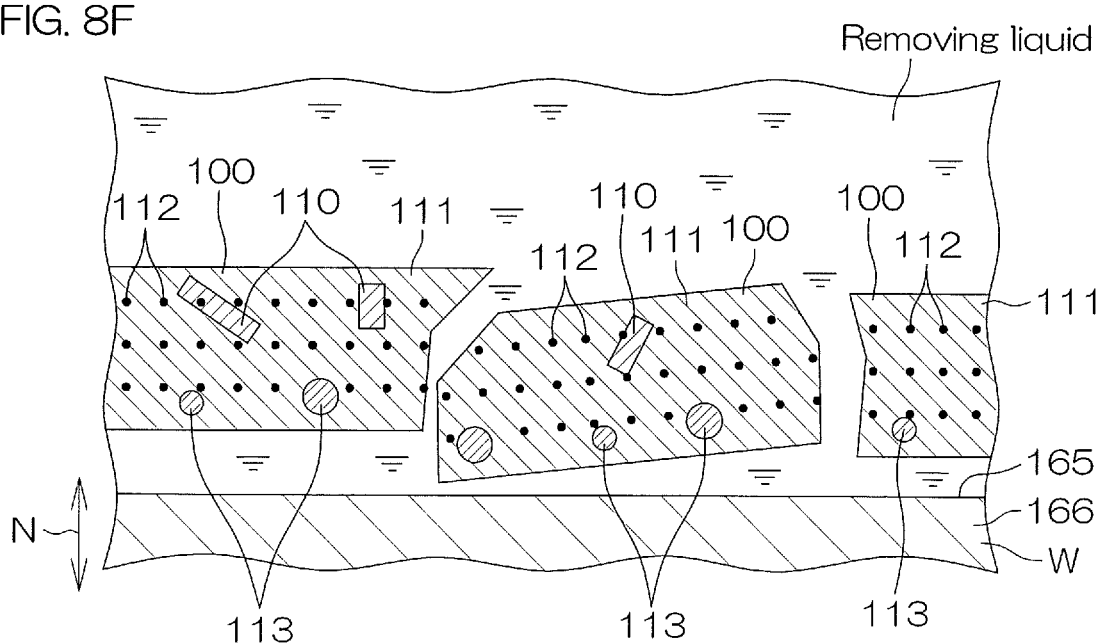
FIG. 8F is a schematic view for describing conditions of the surface of the substrate during the removing step of the substrate processing in a case where the substrate processing is performed by using the substrate which has been processed by CMP.

Then, for example, with the peripheral edge of the through hole 107 as a starting point, the processing film 100 is split into film fragments, and as shown in FIG. 8F, the film fragments of the processing film 100 are peeled from the substrate W in a state of holding the spherical residues 113 (removal objects) (processing film splitting step, peeling step). Then, in a state of being held by the processing film 100, the spherical residues 113 are pushed to the outside of the substrate W together with the processing film 100 and removed from the pattern surface 165 of the substrate W (removing step).

According to an configuration that the substrate processing according to the present preferred embodiment is performed after CMP, the spherical residue 113 (removal object) is partially dissolved by the dissolution component contained in the processing liquid. Therefore, the processing liquid supplying step is executed, by which the processing liquid easily enters between the spherical residue 113 and the pattern surface 165 of the substrate W. In the processing film forming step, if the processing liquid is solidified or cured in a state that the processing liquid has entered between the spherical residue 113 and the pattern surface 165 of the substrate W, a part of the processing film 100 is formed between the spherical residue 113 and the surface of the substrate W. Therefore, in the removing step, while holding the spherical residue 113 (removal object) with a sufficient holding force, the processing film 100 is removed from the pattern surface 165 of the substrate W by the removing liquid. As a result, the spherical residue 113 (removal object) can be efficiently removed from the pattern surface 165 of the substrate W.

Incidentally, unlike the substrate processing according to the present preferred embodiment, in a method that after supply of a dissolving liquid that contains a dissolution component (for example, hydrofluoric acid) to a pattern surface 165 of a substrate W, the dissolving liquid is rinsed by a rinse liquid and a processing liquid that contains no dissolution component is thereafter supplied to the substrate in order to form a processing film, the plurality of liquids are supplied sequentially to the pattern surface 165 of the substrate W. Therefore, every time the liquid is replaced on the substrate W, a turbulent flow is likely to occur around the spherical residues 113 (removal objects). Further, when hydrofluoric acid is replaced by the rinse liquid, the liquid around the film-like residue 103 is changed from acidic to neutral. Due to the occurrence of the turbulent flow and the change in property of the liquid, the spherical residues 113 which have once separated from the pattern surface 165 of the substrate W by the dissolving liquid may reattach to the pattern surface 165 of the substrate W before being held by the processing film 100.

On the other hand, in the substrate processing method according to the present preferred embodiment, after supply of the processing liquid that contains the dissolution component to the pattern surface 165 of the substrate W, the processing film 100 is formed without replacement of the processing liquid by another liquid. Therefore, the processing film 100 can be quickly formed after the dissolution object is dissolved. Consequently, the processing film 100 can be formed, while maintaining a state that the spherical residues 113 (removal objects) are separated from the pattern surface 165 of the substrate W.

It is also possible to omit the step of supplying the dissolving liquid to the upper surface of the substrate W and the step of supplying the rinse liquid to the upper surface of the substrate W. Consequently, the time necessary for the substrate processing can be shortened.

Further, in this substrate processing, the processing liquid is solidified or cured to suppress the progress of dissolution of the spherical residues 113 by the dissolution component (dissolution suppressing step). Therefore, it is possible to avoid an excessive dissolution of the spherical residues 113 by the dissolution component.

Further, in this substrate processing, the solute in the processing liquid has a dissolution component, a high solubility component, and a low solubility component which is less likely to be dissolved in the removing liquid than the high solubility component. The processing film 100 has a high solubility solid 110, a low solubility solid 111, and a dissolution component solid 112. In the removing step, the high solubility solid 110 in the processing film 100 is selectively dissolved in the removing liquid. Therefore, the high solubility solid 110 is dissolved in the removing liquid, thus the removing liquid can act on the contact interface between the processing film 100 and the substrate W. On the other hand, the low solubility component in the processing film 100 is maintained in a solid state without being dissolved. Consequently, while removal objects are held by the low solubility solid 111, the removing liquid can act on the contact interface between the low solubility solid 111 and the substrate W. As a result, it is possible to quickly remove the processing film 100 from the pattern surface 165 of the substrate W and efficiently remove the spherical residues 113 (removal objects) together with the processing film 100 from the pattern surface 165 of the substrate W.

In this substrate processing, the spherical residues 113 (removal objects) are chemically bonded to the pattern surface 165 of the substrate W. In order that the spherical residues 113 (removal objects) held by the processing film 100 are separated from the pattern surface 165 of the substrate W, such a method is conceivable that the removing liquid is supplied at a great flow rate to the pattern surface 165 of the substrate W, thereby increasing a physical force (kinetic energy) acting on the spherical residues 113 from the removing liquid.

However, where the spherical residues 113 are chemically bonded to the pattern surface 165 of the substrate W, the spherical residues 113 are held by the processing film 100, and it is difficult to separate the spherical residues 113 from the pattern surface 165 of the substrate W by the physical force of the removing liquid alone, even if the physical force from the removing liquid is increased.

Thus, like this substrate processing, if the front layer 166 of the substrate W and the spherical residues 113 are both partially dissolved by the dissolution component contained in the processing liquid, the spherical residues 113 can be separated from the pattern surface 165 of the substrate W, irrespective of the bonding strength of the spherical residues 113 with the pattern surface 165 of the substrate W. Consequently, even where the spherical residues 113 are chemically bonded to the pattern surface 165 of the substrate W, the spherical residues 113 can be efficiently removed from the pattern surface 165 of the substrate W.

Further, in this substrate processing, the spherical residues 113 cover at least a part of the pattern surface 165 of the substrate. Unlike this substrate processing, where the processing film 100 is formed by a processing liquid that has no dissolution component, it is difficult for the processing liquid to enter between the spherical residues 113 and the pattern surface 165 of the substrate W.

However, in this substrate processing, the spherical residues 113 and the pattern surface 165 of the substrate W are both partially dissolved by the dissolution component in the processing liquid. The gap G3 is thereby formed between the spherical residues 113 and the pattern surface 165 of the substrate W. Therefore, the processing liquid can enter between the spherical residues 113 and the pattern surface 165 of the substrate W.

Further, in this substrate processing, not only when the processing liquid is present on the pattern surface 165 of the substrate W but also after the processing film 100 has been formed, the front layer 166 of the substrate W is dissolved by the dissolution component in the processing film 100. It is therefore possible to reduce the close adhesion of the processing film 100 to the pattern surface 165 of the substrate W. Thereby, in the removing step after the processing film forming step, the processing film 100 can be easily peeled from the pattern surface 165 of the substrate W. That is, the processing film 100 in a state of holding the removal objects (spherical residues 113) can be efficiently removed from the pattern surface 165 of the substrate W.

Since the processing film 100 is formed by the processing liquid which is solidified or cured, it is lower in fluidity than the liquid film 101 of the processing liquid. Therefore, the gap G4 formed between the processing film 100 and the pattern surface 165 of the substrate W is maintained without being filled by the processing film 100. Therefore, in the removing step after the processing film forming step, the removing liquid can easily enter the gap G4 between the processing film 100 and the pattern surface 165 of the substrate W. Thereby, the processing film 100 in a state of holding the removal objects (spherical residues 113) can be efficiently removed from the pattern surface 165 of the substrate W.

<Details of Processing Liquid>

Each of the components in the processing liquid used in the above preferred embodiments will be described below.

Hereinafter, expressions of "Cx to y," "Cx to Cy," and "Cx" mean the number of carbons in a molecule or a substituent. For example, $C_{1-6}$ alkyl means an alkyl chain (methyl, ethyl, propyl, butyl, pentyl, hexyl, etc.) having carbon atoms of not less than 1 and not more than 6.

Where a polymer has plural types of repeating units, these repeating units undergo copolymerization. Unless otherwise specified in a limited manner, the copolymerization may be alternating copolymerization, random copolymerization, block copolymerization, graft copolymerization or a mixture of them. Where a polymer and a resin are indicated by a structural formula, n, m, etc., written together in parentheses indicate the number of repetitions.

<Low Solubility Component>

(A) The low solubility component contains at least one of novolak, polyhydroxystyrene, polystyrene, a polyacrylic acid derivative, a polymaleic acid derivative, polycarbonate, a polyvinyl alcohol derivative, a polymethacrylic acid derivative, and a copolymer of their combination. Preferably, (A) the low solubility component may contain at least one of novolak, polyhydroxystyrene, a polyacrylic acid derivative, polycarbonate, a polymethacrylic acid derivative, and a copolymer of their combination. More preferably (A) the low solubility component may contain at least one of novolak, polyhydroxystyrene, polycarbonate, and a copolymer of their combination. Novolak may be phenol novolak.

The processing liquid may contain a combination of one or two or more of the above-described favorable examples as (A) the low solubility component. For example, (A) the low solubility component may contain both novolak and polyhydroxystyrene.

(A) Such a mode is preferable that the low solubility component is made into a film by drying and the film is not substantially dissolved by the removing liquid but is peeled, with removal objects being held. It is noted that such a mode is permissible that (A) only a small part of the low solubility component is dissolved by the removing liquid.

Preferably, (A) the low solubility component does not contain fluorine and/or silicon, and more preferably it contains neither of them.

The aforementioned copolymerization is preferably random copolymerization of block copolymerization.

With no intention to limit the scope of claims, (A) specific examples of the low solubility component include the following compounds expressed by Chemical Formula 1 to Chemical Formula 7 given below.

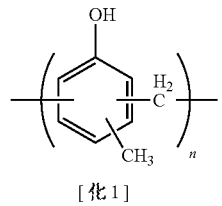

[Chemical Formula 1]

[化1]

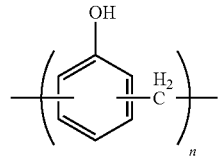

[Chemical Formula 2]

[化2]

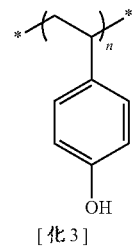

[Chemical Formula 3]

[化3]

(Asterisk * indicates a bonding to an adjacent constituent unit)

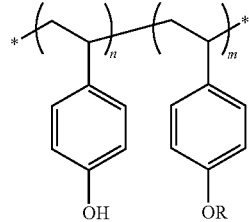

[Chemical Formula 4]

[化4]

(R represents a substituent such as $C_{1-4}$ alkyl. Asterisk* indicates a bonding to an adjacent constituent unit)

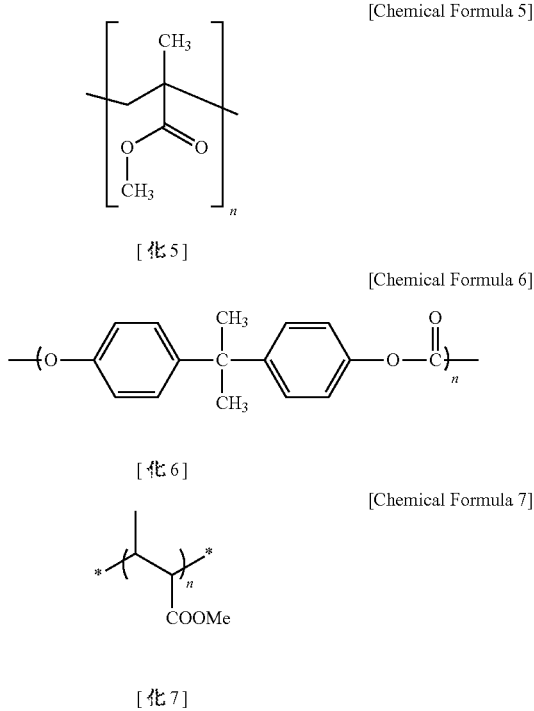

[Chemical Formula 5]

[化 5]

[Chemical Formula 6]

[化 6]

[Chemical Formula 7]

[化 7]

(Me represents a methyl group.)

(A) A weight average molecular weight (Mw) of the low solubility component is preferably 150 to 500,000, more preferably 300 to 300,000, further more preferably 500 to 100,000, and still further more preferably 1,000 to 50,000.

(A) The low solubility component can be obtained by synthesis. They can also be purchased. Where purchased, the following are suppliers. The suppliers are also able to synthesize (A) polymers.

Novolak: Showa Chemical Industry Co., Ltd., Asahi Yukizai Corporation, Gun Ei Chemical Industry Co., Ltd., Sumitomo Bakelite Co., Ltd.
Polyhydroxystyrene: Nippon Soda Co., Ltd., Maruzen Petrochemical Co., Ltd., Toho Chemical Industry Co., Ltd.
Polyacrylic acid derivative: Nippon Shokubai Co., Ltd.
Polycarbonate: Sigma-Aldrich
Polymethacrylic acid derivative: Sigma-Aldrich As compared with a total mass of the processing liquid, (A) the low solubility component is 0.1 to 50 mass %, preferably 0.5 to 30 mass %, more preferably 1 to 20 mass %, and further more preferably 1 to 10 mass %. That is, where the total mass of the processing liquid is given as 100 mass % and used as a reference, (A) the low solubility component is 0.1 to 50 mass %. That is, "as compared with" can be read as "as a reference". Unless otherwise specified, the same shall apply to the following.

The solubility can be evaluated by a known method. Under the conditions of, for example, 20° C. to 35° C. (more preferably, 25±2° C.), the aforementioned (A) or (B) described later is added in a quantity of 100 ppm to ammonia water of 5.0 mass % in a flask, the flask is capped and shaken for 3 hours by a shaker, and the solubility can be determined by whether (A) or (B) is dissolved or not. Shaking may be agitation. The dissolution can also be determined visually. Where no dissolution is found, the solubility is to be less than 100 ppm, and where dissolution is found, the solubility is to be not less than 100 ppm. The solubility which is less than 100 ppm is determined to be insoluble or sparingly soluble, and the solubility which is not less than 100 ppm is determined to be soluble. In a broad sense, being soluble includes being slightly soluble. Being insoluble is the lowest in solubility, followed by sparingly soluble and being soluble. In a narrow sense, being slightly soluble is lower in solubility than being soluble and higher in solubility than being sparingly soluble.

<High Solubility Component>

(B) The high solubility component is (B') a crack promoting component. (B') The crack promoting component contains hydrocarbon and also contains a hydroxy group (—OH) and/or a carbonyl group (—C(=O)—). Where (B') the crack promoting component is a polymer, one type of constituent unit contains hydrocarbon for each unit and also has a hydroxy group and/or a carbonyl group. The carbonyl group includes carboxylic acid (—COOH), aldehyde, ketone, ester, amide, and enone, and carboxylic acid is preferable.

With no intention to limit the scope of claims or without being constrained by theory, when a processing liquid is dried to form a processing film on a substrate and a removing liquid peels the processing film, (B) the high solubility component is thought to yield a portion which gives a chance to peel the processing film. Therefore, (B) the high solubility component is preferably higher in solubility with respect to the removing liquid than (A) the low solubility component. A mode that (B') the crack promoting component contains ketone as a carbonyl group includes a cyclic hydrocarbon. The specific example includes 1,2-cyclohexanedione and 1,3-cyclohexanedione, specifically.

As a more specific mode, (B) the high solubility component is represented by at least any one of the following (B-1), (B-2), and (B-3).

(B-1) is a compound which contains 1 to 6 (preferably 1 to 4) of Chemical Formula 8 given below as a constituent unit and in which each constituent unit is bonded by a linking group (linker) $L_1$. Here, the linker $L_1$ may be a single bond or may be $C_{1-6}$ alkylene. The $C_{1-6}$ alkylene links a constituent unit as a linker and is not limited to a divalent group. Divalent to tetravalent groups are preferable. The $C_{1-6}$ alkylene may be either a linear chain or a branched chain.

[Chemical Formula 8]

[化 8]

$Cy_1$ is a hydrocarbon ring of $C_{5-30}$ and preferably phenyl, cyclohexane or naphtyl and more preferably phenyl. As a favorable mode, the linker $L_1$ links a plurality of $Cy_1$.

$R_1$ is each independently $C_{1-5}$ alkyl and preferably methyl, ethyl, propyl or butyl. The $C_{1-5}$ alkyl may be either a linear chain or a branched chain.

$n_{b1}$ is 1, 2, or 3, preferably 1 or 2 and more preferably 1. $n_{b1'}$ is 0, 1, 2, 3, or 4 and preferably 0, 1 or 2.

Chemical Formula 9 below is a chemical formula of the constituent unit of Chemical Formula 8 expressed by using a linker $L_9$. The linker $L_9$ is preferably a single bond, methylene, ethylene or propylene.

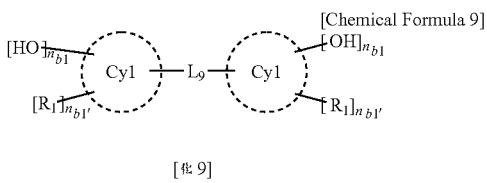

[化 9]

With no intention to limit the scope of claims, favorable examples of (B-1) include 2,2-bis(4-hydroxyphenyl)propane, 2,2'-methylenebis(4-methylphenol), 2,6-bis[(2-hydroxy-5-methylphenyl)methyl]-4-methylphenol, 1,3-cyclohexanediol, 4,4'-dihydroxybiphenyl, 2,6-naphthalenediol, 2,5-di-tert-butylhydroquinone, and 1,1,2,2-tetrakis(4-hydroxyphenyl)ethane. These may be obtained by polymerization or condensation.

As an example, 2,6-bis[(2-hydroxy-5-methylphenyl)methyl]-4-methylphenol shown in Chemical Formula 10 below will be described. This compound has three constituent units of Chemical Formula 8 in (B-1) and the constituent units are linked by the linker $L_1$ (methylene). $n_{b1}=n_{b1'}=1$ and $R_1$ is methyl.

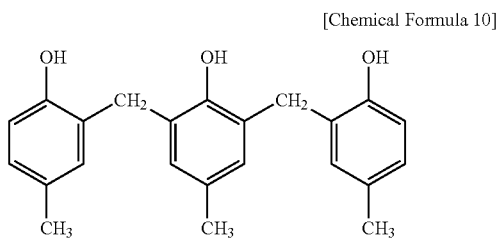

[化 10]

(B-2) is expressed by Chemical Formula 11.

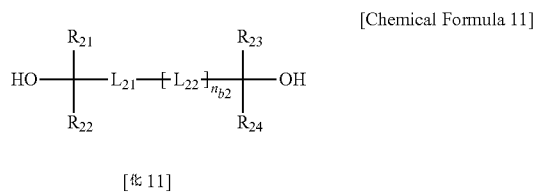

[化 11]

$R_{21}$, $R_{22}$, $R_{23}$, and $R_{24}$ are each independently hydrogen or $C_{1\sim5}$ alkyl, preferably hydrogen, methyl, ethyl, t-butyl or isopropyl, more preferably hydrogen, methyl or ethyl, and further more preferably methyl or ethyl.

Linker $L_{21}$ and linker $L_{22}$ are each independently $C_{1\sim20}$ alkylene, $C_{1\sim20}$ cycloalkylene, $C_{2\sim4}$ alkenylene, $C_{2\sim4}$ alkynylene or $C_{6\sim20}$ arylene. These groups may be substituted by $C_{1\sim5}$ alkyl or hydroxy. Here, alkenylene means divalent hydrocarbon having one or more double bonds, and alkynylene means a divalent hydrocarbon group having one or more triple bonds. Linker $L_{21}$ and linker $L_{22}$ are preferably $C_{2\sim4}$ alkylene, acetylene ($C_2$ alkynylene), or phenylene, more preferably $C_{2\sim4}$ alkylene or acetylene, and more preferably acetylene.

nb2 is 0, 1 or 2, preferably 0 or 1, and more preferably 0.

With no intention to limit the scope of claims, favorable examples of (B-2) include 3,6-dimethyl-4-octyne-3,6-diol and 2,5-dimethyl-3-hexene-2,5-diol. Favorable examples of (B-2) in another form include 3-hexene-2,5-diol, 1,4-butynediol, 2,4-hexadiene-1,6-diol, 1,4-butanediol, cis-1,4-dihydroxy-2-butane, and 1,4-benzenedimethanol.

(B-3) is a polymer which contains the constituent unit expressed by Chemical Formula 12 below and has a weight average molecular weight (Mw) of 500 to 10,000. Mw is preferably 600 to 5,000 and more preferably 700 to 3,000.

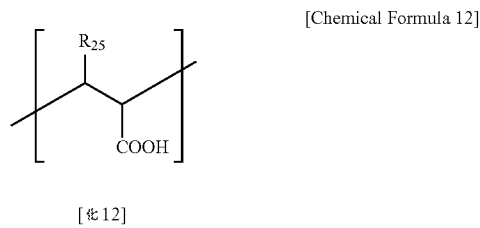

[化 12]

Here, $R_{25}$ is —H, —$CH_3$ or —COOH and preferably —H or —COOH. One (B-3) polymer may contain two or more constituent units, each of which is expressed by Chemical Formula 12.

With no intention to limit the scope of claims, favorable examples of (B-3) polymer include acrylic acid, maleic acid, and a polymer of their combination. More favorable examples are polyacrylic acid and a maleic acid/acrylic acid copolymer.

In the case of copolymerization, random copolymerization and block copolymerization are preferable, and random copolymerization is more preferable.

As an example, the maleic acid/acrylic acid copolymer shown in Chemical Formula 13 below will be described. The copolymer is included in (B-3) and has two types of constituent units expressed by Chemical Formula 12 in which $R_{25}$ is —H in one constituent unit and $R_{25}$ is —COOH in the other constituent unit.

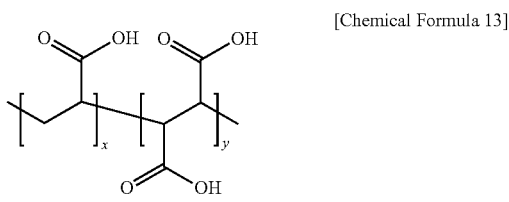

[化 13]

As a matter of course, the processing liquid may contain a combination of one or two or more of the favorable examples as (B) the high solubility component. For example, (B) the high solubility component may contain both 2,2-bis (4-hydroxyphenyl)propane and 3,6-dimethyl-4-octyne-3,6-diol.

(B) The high solubility component may be 80 to 10,000 in molecular weight. The high solubility component is preferably 90 to 5000 in molecular weight and more preferably 100 to 3000. Where (B) the high solubility component is a resin, a polymeride, or a polymer, the molecular weight is expressed by a weight average molecular weight (Mw).

(B) The high solubility component can be obtained by synthesis or purchase. Suppliers include Sigma-Aldrich, Tokyo Chemical Industry Co., Ltd., and Nippon Shokubai Co., Ltd.

In the processing liquid, as compared with a mass of (A) the low solubility component, (B) the high solubility component is preferably 1 to 100 mass % and more preferably 1 to 50 mass %. In the processing liquid, as compared with the mass of (A) the low solubility component, (B) the high solubility component is further more preferably 1 to 30 mass %.

<Solvent>

(C) The solvent preferably contains an organic solvent. (C) The solvent may have volatility. To have volatility means that it is higher in volatility than water. For example, (C) a boiling point of the solvent at one atmospheric pressure is preferably 50 to 250° C. The boiling point of the solvent at one atmospheric pressure is more preferably 50 to 200° C. and further more preferably 60 to 170° C. The boiling point of the solvent at one atmospheric pressure is still further more preferably 70 to 150° C. (C) The solvent may contain a small amount of pure water. (C) Pure water contained in the solvent is preferably not more than 30 mass %, as compared with an entirety of (C) the solvent. Pure water contained in the solvent is more preferably not more than 20 mass % and further more preferably not more than 10 mass %. Pure water contained in the solvent is still further more preferably not more than 5 mass %. Another favorable form is that the solvent does not contain pure water (0 mass %). Pure water is favorably DIW.

The organic solvent includes alcohols such as isopropanol (IPA); ethylene glycol monoalkyl ethers such as ethylene glycol monomethyl ether, ethylene glycol monoethyl ether; ethylene glycol monoalkyl ether acetates such as ethylene glycol monomethyl ether acetate, ethylene glycol monoethyl ether acetate; propylene glycol monoalkyl ethers such as propylene glycol monomethyl ether (PGME), propylene glycol monoethyl ether (PGEE); propylene glycol monoalkyl ether acetates such as propylene glycol monomethyl ether acetate (PGMEA), propylene glycol monoethyl ether acetate; esters of lactic acid such as methyl lactate, ethyl lactate (EL); aromatic hydrocarbons such as toluene, xylene; ketones such as methyl ethyl ketone, 2-heptanone cyclohexane; amides such as N,N-dimethyl acetamide, N-methylpyrrolidone; and lactones such as γ-butyrolactone. These organic solvents may be used solely or in a mixture of two or more of them.

As a preferable mode, the organic solvent contained in (C) the solvent is selected from IPA, PGME, PGEE, EL, PGMEA, and any combination of these. Where the organic solvent is a combination of two or more of them, a volume ratio thereof is preferably 20:80 to 80:20 and more preferably 30:70 to 70:30.

As compared with a total mass of the processing liquid, (C) the solvent is 0.1 to 99.9 mass %. As compared with the total mass of the processing liquid, (C) the solvent is preferably 50 to 99.9 mass %, and more preferably 75 to 99.5 mass %. As compared with the total mass of the processing liquid, (C) the solvent is further more preferably 80 to 99 mass %, and still further more preferably 85 to 99 mass %.

<Other Additives>

The processing liquid of the present invention may also contain (D) other additives. As a mode of the present invention, (D) other additives include a surfactant, an acid, a base, an anti-bacterial agent, a sterilizer, an antiseptic agent, and a fungicide (preferably, surfactant) and may contain any combination of these.

As a mode of the present invention, as compared with a mass of (A) the low solubility component in the processing liquid, a mass of (D) other additives (a sum thereof in the case of a plurality of them) is 0 to 100 mass % (preferably 0 to 10 mass %, more preferably 0 to 5 mass %, further more preferably 0 to 3 mass %, and still further more preferably 0 to 1 mass %). Another mode of the present invention is that the processing liquid does not contain (D) other additives (0 mass %).

<Dissolution Component>

(E) The dissolution component is, for example, mineral acid, organic acid, or organic alkali. The mineral acid used as the dissolution component includes HF, HCl, $H_3PO_4$, $H_2SO_4$, etc. The organic acid used as the dissolution component includes formic acid, acetic acid, butyric acid, monochloroacetic acid, dichloroacetic acid, trichloroacetic acid, monofluoroacetic acid, difluroroacetic acid, trifluoroacetic acid, monobromoacetic acid, tribromoacetic acid, perfluoropropionic acid, perfluorobutanoic acid, perfluoropentanoic acid, perfluorohexanoic acid, perfluoroheptanoic acid, perfluorooctanoic acid, perfluorononanoic acid, perfluorodecanoic acid, perfluoroundecanoic acid, perfluorododecanoic acid, 3,3,3-trifluoro-2-(trifluoromethyl)propionic acid, 3H-tetrafluoropropionic acid, 5H-octafluoropentanoic acid, 7H-dodecafluoroheptanoic acid, methanesulfonic acid, etc.

The organic acid used as the dissolution component is not limited to the above description and may include carboxylic acid and sulfonic acid that are fluorinated other than the above-described carboxylic acid and sulfonic acid. Fluorinated carboxylic acid is such carboxylic acid that some of or all hydrogen atoms in an alkyl group adjacent to a carboxyl group (for example, methyl group, ethyl group, propyl group, etc.) are replaced by fluorine atoms.

Similarly, fluorinated sulfonic acid is such sulfonic acid that some of or all hydrogen atoms in an alkyl group adjacent to a sulfo group (for example, methyl group, ethyl group, propyl group, etc.) are replaced by fluorine atoms.

The organic alkali used as the dissolution component includes ammonia, hydroxylamine, primary amine, secondary amine, tertiary amine, quaternary ammonium salt, polyamine, etc.

<Corrosion Preventing Component>

(F) The corrosion preventing component includes uric acid, caffeine, buterine, adenine, glyoxylic acid, glucose, fructose, mannose, etc., in addition to BTA.

OTHER PREFERRED EMBODIMENTS

The present invention is not limited to the above preferred embodiments and can be executed in still other embodiments.

For example, in the above preferred embodiments, a description has been given of a case where the removal objects (film-like residues 103) are partially dissolved by the dissolution component contained in the processing liquid (refer to FIG. 7A to FIG. 7E) and a case where the removal objects (spherical residues 113) and the front layer 166 of the substrate W are partially dissolved by the dissolution component contained in the processing liquid (refer to FIG. 8A to FIG. 8F). However, unlike the above preferred embodiments, the dissolution component contained in the processing liquid may partially dissolve the front layer 166 of the substrate W without dissolution of the removal objects.

Further, in the above preferred embodiments, where the substrate processing according to the above preferred embodiments is executed after CMP to form the processing film 100, the gap G4 is formed between the processing film 100 and the pattern surface 165. However, the gap G4 may not be clearly formed between the processing film 100 and the pattern surface 165 so as to be clearly confirmed by an analytical instrument. The front layer 166 of the substrate W may be dissolved to such an extent that close adhesion of the processing film 100 to the pattern surface 165 is reduced by the dissolution component in the processing film 100.

Similarly, the other gaps G1 to G3 may not be clearly formed so as to be confirmed by an analytical instrument. That is, with reference to FIG. 7B, the dissolution component in the processing liquid may dissolve the residual film fragments 106 to such an extent that close adhesion of the residual film fragments 106 to the pattern surface 165 is reduced. With reference to FIG. 7D, the removing liquid may dissolve the low solubility solid 111 to such an extent that close adhesion of the processing film 100 to the pattern surface 165 is reduced. Further, with reference to FIG. 8B, the dissolution component in the processing liquid may dissolve the residues 113 and the front layer 166 of the substrate W to such an extent that close adhesion of the residual film fragments 106 to the pattern surface 165 is reduced.

Further, in the above preferred embodiments, the solute of the processing liquid contains at least a dissolution component, a high solubility component, and a low solubility component. However, it is also possible to use a processing liquid in which the solute does not contain the high solubility component but contains the low solubility component and the dissolution component. In this case, the processing film 100 is constituted of the low solubility solid 111 and the dissolution component solid 112. In this case, the removing liquid dissolves a part of the low solubility solid 111 to thereby remove the processing film 100 from the upper surface of the substrate W.

Further, in the film thinning step (Step S3), there is a case in which the solvent is evaporated when the liquid film 101 of the processing liquid is made thin, to form the processing film 100. In this case, the solvent evaporating step (Step S4) can be omitted. In this case, the processing film forming unit does not include the central nozzle 11 and the lower surface nozzle 12, and the processing film forming unit is constituted of the substrate rotating unit (spin motor 23). Further, in the solvent evaporating step (Step S4), only the heating step may be omitted or only the gas supplying step may be omitted.

Further, in the aforementioned substrate processing, the rinsing step (Step S6) is executed after the removing step (Step S5). However, the rinsing step may be omitted. In details, where the removing liquid supplied to the substrate W in the removing step has compatibility with the processing film residue removing liquid supplied to the substrate W in the processing film residue removing step (Step S7) that is executed after the rinsing step, execution of the rinsing step is not needed.

While the preferred embodiments of the present invention have been described in detail, these are merely specific examples used to clarify the technical content of the present invention and the present invention should not be interpreted as being limited to these specific examples, and the scope of the present invention shall be limited only by the appended claims.

This application corresponds to Japanese Patent Application No. 2019-122030 filed on Jun. 28, 2019 with the Japan Patent Office, and the entire disclosure of this application is incorporated herein by reference.

REFERENCE SIGNS LIST

1: substrate processing apparatus
9: first moving nozzle (processing liquid supplying unit)
10: second moving nozzle (removing liquid supplying unit)
11: central nozzle (processing film forming unit)
12: lower surface nozzle (processing film forming unit)
23: spin motor (processing film forming unit)
100: processing film
103: residues (removal object, removal film, dissolution object)
113: residues (removal object, dissolution object)
166: front layer of substrate
W: substrate

The invention claimed is:

1. A substrate processing method comprising:
a processing liquid supplying step which supplies a processing liquid to a surface of a substrate;
a processing film forming step in which the processing liquid on the surface of the substrate is solidified or cured to form a processing film that holds removal objects present on the surface of the substrate; and
a removing step in which a removing liquid is supplied to the surface of the substrate, after the processing film forming step, to thereby remove the processing film from the surface of the substrate in a state that the removal objects are held by the processing film such that the processing film in the state of holding the removal objects is pushed to outside of the substrate, wherein
the processing liquid contains a dissolution component which dissolves at least one of a front layer of the substrate and the removal objects as a dissolution object, a high solubility component, and a low solubility component which is less likely to be dissolved in the removing liquid than the high solubility component,
the high solubility component forms, in the processing film forming step, a high solubility solid which is the dissolution component in a solid state, and at least some of the high solubility solid is locally present and extends in the processing film from the surface of the processing film to the surface of the substrate,
the low solubility component forms, in the processing film forming step, a low solubility solid which is the low solubility component in a solid state,
the dissolution object includes at least the removal objects,
the removal objects include a removal film which covers at least a part of the surface of the substrate,
the processing liquid supplying step includes a dissolution step which partially dissolves the dissolution object by the dissolution component in the processing liquid supplied to the surface of the substrate,
in the dissolution step, the removal film is partially dissolved by the dissolution component in the processing liquid so as to be split into film fragments,
the processing film formed in the processing film forming step holds the film fragments of the removal film, and
in the removing step, the removing liquid dissolves the low solubility solid in a vicinity of the surface of the substrate, and enters a gap between the processing film and the surface of the substrate, thereby to peel the processing film from the substrate in a state of holding the film fragments of the removal film.

2. The substrate processing method according to claim 1, wherein the processing film forming step includes a step of solidifying or curing the processing liquid in a state that the processing liquid has entered between the removal objects and the surface of the substrate.

3. The substrate processing method according to claim 1, wherein
the processing film forming step includes a dissolution suppressing step in which the processing liquid is solidified or cured to thereby suppress the progress of dissolution of the dissolution object by the dissolution component.

4. The substrate processing method according to claim 1, wherein
the dissolution object includes at least the front layer of the substrate, and
the dissolution step includes a step of dissolving the front layer of the substrate by the dissolution component in the processing liquid in the vicinity of a contact interface between the processing film and the substrate.

5. The substrate processing method according to claim 1, wherein
the dissolution object includes at least the front layer of the substrate, and
the dissolution step includes a step of dissolving the front layer of the substrate by the dissolution component in the processing liquid to thereby form a gap between the processing film and the surface of the substrate.

6. The substrate processing method according to claim 1, wherein
the processing liquid has a solute and a solvent that dissolves the solute,
the solute has the dissolution component, the high solubility component, and the low solubility component,
the processing film forming step includes a step of forming the processing film that has the high solubility solid, the low solubility solid, and the dissolution component in a solid state, and
the removing step includes a step of selectively dissolving in the removing liquid the high solubility component in a solid state in the processing film.

7. The substrate processing method according to claim 1, wherein
the removal objects present on the surface of the substrate are chemically bonded to the surface of the substrate.

8. The substrate processing method according to claim 1, wherein
the removal film is a residue generated by dry etching.

9. The substrate processing method according to claim 7, wherein
the dissolution object includes the front layer of the substrate and the removal objects, and
the removal objects are residues generated by chemical mechanical polishing.

10. The substrate processing method according to claim 1, wherein
the dissolution step includes a step of dissolving the front layer of the substrate by the dissolution component in the processing liquid such that the removal object is separated from the surface of the substrate.

* * * * *